(12) United States Patent
Maassen van den Brink et al.

(10) Patent No.: US 9,727,527 B2
(45) Date of Patent: *Aug. 8, 2017

(54) ANALOG PROCESSOR COMPRISING QUANTUM DEVICES

(71) Applicant: D-Wave Systems Inc., Burnaby (CA)

(72) Inventors: Alexander Maassen van den Brink, Taipei (TW); Peter Love, Haverford, PA (US); Mohammad H. S. Amin, Burnaby (CA); Geordie Rose, Vancouver (CA); David Grant, Vancouver (CA); Miles F. H. Steininger, Vancouver (CA); Paul I. Bunyk, Vancouver (CA); Andrew J. Berkley, Vancouver (CA)

(73) Assignee: D-Wave Systems Inc., Burnaby, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 14/727,521

(22) Filed: Jun. 1, 2015

(65) Prior Publication Data
US 2015/0332164 A1 Nov. 19, 2015

Related U.S. Application Data

(60) Continuation of application No. 14/175,731, filed on Feb. 7, 2014, now Pat. No. 9,069,928, which is a
(Continued)

(51) Int. Cl.
*G06F 15/76* (2006.01)
*H03K 19/195* (2006.01)
(Continued)

(52) U.S. Cl.
CPC ............ *G06F 15/76* (2013.01); *G06N 99/002* (2013.01); *H03K 3/38* (2013.01); *H04L 67/12* (2013.01); *B82Y 10/00* (2013.01)

(58) Field of Classification Search
CPC ............................. G06N 99/002; H03K 3/38
See application file for complete search history.

(56) References Cited

U.S. PATENT DOCUMENTS 6,437,413 B1 8/2002 Yamaguchi et al.
6,597,010 B2 7/2003 Eriksson et al.
(Continued)

FOREIGN PATENT DOCUMENTS

WO 02/27653 A2 4/2002

OTHER PUBLICATIONS

Aaronson, "Thanksgiving Special: D-Wave at MIT," Shtetl-Optimized—The Blog of Scott Aaronson, URL=http://www.scottaaronson.com/blog/?p=291, retrieved Apr. 14, 2011 (originally retrieved Nov. 28, 2007), 54 pages.
(Continued)

*Primary Examiner* — Jany Richardson
(74) *Attorney, Agent, or Firm* — Seed IP Law Group LLP

(57) ABSTRACT

Analog processors for solving various computational problems are provided. Such analog processors comprise a plurality of quantum devices, arranged in a lattice, together with a plurality of coupling devices. The analog processors further comprise bias control systems each configured to apply a local effective bias on a corresponding quantum device. A set of coupling devices in the plurality of coupling devices is configured to couple nearest-neighbor quantum devices in the lattice. Another set of coupling devices is configured to couple next-nearest neighbor quantum devices. The analog processors further comprise a plurality of coupling control systems each configured to tune the coupling value of a corresponding coupling device in the plurality of coupling devices to a coupling. Such quantum processors further comprise a set of readout devices each
(Continued)

configured to measure the information from a corresponding quantum device in the plurality of quantum devices.

22 Claims, 18 Drawing Sheets

Related U.S. Application Data division of application No. 13/608,836, filed on Sep. 10, 2012, now Pat. No. 8,686,751, which is a division of application No. 13/210,169, filed on Aug. 15, 2011, now Pat. No. 8,283,943, which is a division of application No. 12/397,999, filed on Mar. 4, 2009, now Pat. No. 8,008,942, which is a division of application No. 11/317,838, filed on Dec. 22, 2005, now Pat. No. 7,533,068.

(60) Provisional application No. 60/705,503, filed on Aug. 3, 2005, provisional application No. 60/638,600, filed on Dec. 23, 2004.

(51) Int. Cl.
　　*H03K 3/38*　　　(2006.01)
　　*H04L 29/08*　　　(2006.01)
　　*G06N 99/00*　　　(2010.01)
　　*B82Y 10/00*　　　(2011.01)

(56) References Cited

U.S. PATENT DOCUMENTS

| | | |
|---|---|---|
| 6,627,915 B1 | 9/2003 | Ustinov et al. |
| 6,670,630 B2 | 12/2003 | Blais et al. |
| 6,784,451 B2 | 8/2004 | Amin et al. |
| 6,822,255 B2 | 11/2004 | Tzalenchuk et al. |
| 6,885,325 B2 | 4/2005 | Omelyanchouk et al. |
| 6,897,468 B2 | 5/2005 | Blais et al. |
| 6,960,780 B2 | 11/2005 | Blais et al. |
| 6,979,836 B2 | 12/2005 | Zagoskin et al. |
| 6,987,282 B2 | 1/2006 | Amin et al. |
| 7,015,499 B1 | 3/2006 | Zagoskin |
| 7,109,593 B2 | 9/2006 | Freedman et al. |
| 7,277,872 B2 | 10/2007 | Raussendorf et al. |
| 7,533,068 B2 | 5/2009 | Maassen van den Brink et al. |
| 8,008,942 B2 | 8/2011 | van Den Brink et al. |
| 8,283,943 B2 | 10/2012 | van Den Brink et al. |
| 8,686,751 B2 | 4/2014 | van Den Brink et al. |
| 9,069,928 B2 | 6/2015 | van Den Brink et al. |
| 2002/0121636 A1 | 9/2002 | Amin et al. |
| 2002/0188578 A1 | 12/2002 | Amin et al. |
| 2003/0055513 A1 | 3/2003 | Raussendorf et al. |
| 2003/0107033 A1 | 6/2003 | Tzalenchuk et al. |
| 2003/0121028 A1 | 6/2003 | Coury et al. |
| 2003/0169041 A1 | 9/2003 | Coury et al. |
| 2003/0173498 A1 | 9/2003 | Blais et al. |
| 2004/0000666 A1 | 1/2004 | Lidar et al. |
| 2004/0016918 A1 | 1/2004 | Amin et al. |
| 2004/0119061 A1 | 6/2004 | Wu et al. |
| 2004/0140537 A1 | 7/2004 | Il'ichev et al. |
| 2005/0224784 A1 | 10/2005 | Amin et al. |
| 2005/0250651 A1 | 11/2005 | Amin et al. |
| 2005/0256007 A1 | 11/2005 | Amin et al. |

OTHER PUBLICATIONS

Barenco et al., "Elementary gates for quantum computation," *Physical Review A* 2 52(5):3457-3467, Nov. 1995.
Barone et al., *Physics and Applications of the Josephson Effect*, John Wiley & Sons, 1982, pp. 416-427.
Berkley, "Methods of Ferromagnetic and Adiabatic Classical Qubit State Copying," U.S. Appl. No. 60/675,139, filed Apr. 26, 2005, 63 pages.
Blais et al., "Tunable Coupling of Superconducting Qubits," *Physical Review Letters* 90(12):127901-1-127901-4, Mar. 28, 2003.
Blatter et al., "Design aspects of superconducting—phase quantum bits," *Physical Review B* 63:174511-1-174511-9, 2001.
Braunstein and Lo (eds.), *Scalable Quantum Computers*, Wiley-VCH, Berlin, 2001.
Bryant et al., "Introduction to Electronic Analogue Computing," *Physics& Mathematics, AEC Research and Development Report*, pp. 2-50, Aug. 1966.
Choudhury, *Handbook of Microlithography, Micromachining and Microfabrication* Volume 1: *Microlithography*, The International Society for Optical Engineering, Bellingham, Washington, 1997.
Cormen et al., *Introduction to Algorithms*, The MIT Press, Cambridge, Massachusetts, pp. 964-985, 2000.
Cosmelli et al., "Controllable Flux Coupling for the Integration of Flux Qubits," arXiv:cond-mat/0403690 v1, pp. 1-10, Mar. 29, 2004.
DiVincenzo, "The Physical Implementation of Quantum Computation," *Fortschr. Phys.* 48:771-783, 2000.
European Search Report, mailed Oct. 13, 2010, for EP 05849198.6, 10 pages.
Friedman et al., "Detection of a Schrodinger's Cat State in an rf-SQUID," arXiv:cond-mat/0004293 2:1-7, Apr. 19, 2000.
Friedman et al., "Quantum superposition of distinct macroscopic states," *Nature* 406:43-46, Jul. 2000.
Garey et al., *Computers and Intractability: A Guide to the Theory of NP-Completeness*, W. H. Freeman and Company, New York, 1979, pp. 1-15.
Grajcar et al., "Adiabatic Quantum Evolution of Superconducting Flux Qubits," arXiv:cond-mat/0407405 v1, pp. 1-7, Jul. 15, 2004.
Han et al., "Time-Resolved Measurement of Dissipation-Induced Decoherence in a Josephson Junction," *Science* 293:1457-1459, Aug. 24, 2001.
Il'ichev et al., "Continuous Monitoring of Rabi Oscillations in a Josephson Flux Qubit," *Physical Review Letters* 91(9):097906-1-097906-4, Aug. 29, 2003.
Inokuchi et al., "Analog computation using quantum-flux parametron devices," *Physica C* 357-360 :1618-1621, 2001.
Kim et al., "Coupling of Josephson Current Qubits Using a Connecting Loop," Physical Review B 70:184525-1-184525-6, 2004.
Lang, "Analog was not a Computer Trademark!," *Sound & Vibration*:16-24, Aug. 2000.
Lantz et al., "Josephson Junction Qubit Network with Current-Controlled Interaction," Proceedings of the Fourth International Workshop on Macroscopic Quantum Coherence and Computing (MQC2'04), Jun. 7-10, 2004, 13 pages.
Levinson, *Principles of Lithography*, The International Society for Optical Engineering, Bellingham, Washington, 2001.
Lidar, "On the quantum computational complexity of the Ising spin glass partition function and of knot invariants," *New Journal of Physics* 6(167): 1-15, 2004.
Maassen van den Brink et al., "Analog Processor Comprising Quantum Devices," U.S. Appl. No. 60/705,503, filed Aug. 3, 2005, 71 pages.
Madou, *Fundamentals of Microfabrication*: The Science of Miniaturization, CRC Press, 2002, pp. 1-14.
Makhlin et al., "Quantum-state engineering with Josephson-junction devices," *Reviews of Modern Physics* 73(2):357-400, Apr. 2001.
Martinis et al., "Rabi Oscillations in a Large Josephson-Junction Qubit," *Physical Review Letters* 89(11):117901-1-117901-4, Sep. 9, 2002.
Mooij et al., "Josephson Persistent-Current Qubit," *Science* 285 :1036-1039, Aug. 13, 1999.
Murray et al., "Coupling Methods and Architectures for Information Processing," U.S. Appl. No. 11/247,857, filed Oct. 10, 2005, 73 pages.
Murray et al., "Coupling Schemes for Information Processing," U.S. Appl. No. 60/640,420, filed Dec. 30, 2004, 44 pages.
Nakamura et al., "Coherent control of macroscopic quantum states in a single-Cooper-pair-box," *Nature* 398:786-788, Apr. 29, 1999.
Nielson et al., *Quantum Computation and Quantum Information*, Cambridge University Press, Cambridge, 2000, 174-177.

(56) References Cited

OTHER PUBLICATIONS

Niskanen et al., "Quantum Coherent Tunable Coupling of Superconducting Qubits," Science 316:723-726, May 4, 2007.
Orlando et al., "Superconducting persistent-current qubit," *Physical Review B* 60(22):15398-15413, Dec. 1, 1999.
Plourde et al., "Entangling Flux Qubits with a Bipolar Dynamic Inductance," Physical Review B 70:140501-1-140501-4, 2004.
Ramos et al., "Design for Effective Thermalization of Junctions for Quantum Coherence," *IEEE Transactions on Applied Superconductivity* 11(1):998-1001, Mar. 2001.
Rose, "Analog Processor With Quantum Devices," U.S. Appl. No. 60/638,600, filed Dec. 23, 2004, 42 pages.
Strauch, Theory of Superconducting Phase Qubits, UMI Microform, Ann Arbor, Michigan, 2005, Chapter 8, "Conclusion," pp. 298-306.
van Dam, "Quantum Computing: In the 'Death Zone'?," Nature Physics 3:220-221, Apr. 2007.
Van Zant, *Microchip Fabrication*, Fourth Edition, McGraw-Hill, New York, 2000.
Wang et al., "Fast Entanglement of Two Charge-Phase Qubits Through Nonadiabatic Couling to a Large Josephson Junction," Physical Review B 70:224515-1-224515-4, 2004.
Wei et al., "Quantum Computation with Josephson-Qubits by Using a Current-Biased Information Bus," arXiv:cond-mat/0407667 v1, pp. 1-13, Jul. 26, 2004.
Wocjan et al., "Treating the Independent Set Problem by 2D Ising Interactions with Adiabatic Quantum Computing," arXiv:quant-ph/0302027 1:1-13, Feb. 4, 2003.
You et al., "Controllable Manipulation and Entanglement of Macroscopic Quantum States in Coupled Charge Qubits," Physical Review B 68:024510-1-024510-8, 2003.
You et al., "Fast Two-Bit Operations in Inductively Coupled Flux Qubits," arXiv:cond-mat/0309491 v1, pp. 1-5, Sep. 22, 2003.
van den Brink et al., "Analog Processor Comprising Quantum Devices," Office Action mailed Aug. 27, 2010, for U.S. Appl. No. 12/397,999, 8 pages.
van den Brink et al., "Analog Processor Comprising Quantum Devices," Amendment filed Nov. 22, 2010, for U.S. Appl. No. 12/397,999, 8 pages.
van den Brink et al., "Analog Processor Comprising Quantum Devices," Office Action mailed Feb. 17, 2012, for U.S. Appl. No. 13/210,169, 12 pages.
van den Brink et al., "Analog Processor Comprising Quantum Devices," Amendment filed May 16, 2012, for U.S. Appl. No. 13/210,169, 9 pages.
van den Brink et al., "Analog Processor Comprising Quantum Devices," Office Action mailed Jun. 16, 2008, for U.S. Appl. No. 11/317,838, 13 pages.
van den Brink et al., "Analog Processor Comprising Quantum Devices," Amendment filed Sep. 16, 2008, for U.S. Appl. No. 11/317,838, 11 pages.
van den Brink et al., "Analog Processor Comprising Quantum Devices," Notice of Allowance mailed Dec. 5, 2008, for U.S. Appl. No. 11/317,838, 10 pages.
van den Brink et al., "Analog Processor Comprising Quantum Devices," Notice of Allowance mailed Apr. 22, 2011, for U.S. Appl. No. 12/397,999, 8 pages.
van den Brink et al., "Analog Processor Comprising Quantum Devices," Preliminary Amendment filed Sep. 9, 2011, for U.S. Appl. No. 13/210,169, 8 pages.
van den Brink et al., "Analog Processor Comprising Quantum Devices," Notice of Allowance mailed Jun. 7, 2012, for U.S. Appl. No. 13/210,169, 8 pages.
van den Brink et al., "Analog Processor Comprising Quantum Devices," Notice of Allowance mailed Nov. 7, 2013, for U.S. Appl. No. 13/608,836, 11 pages.
van den Brink et al., "Analog Processor Comprising Quantum Devices," Preliminary Amendment filed Apr. 24, 2014, for U.S. Appl. No. 14/175,731, 9 pages.
van den Brink et al., "Analog Processor Comprising Quantum Devices," Notice of Allowance mailed Feb. 23, 2015, for U.S. Appl. No. 14/175,731, 10 pages.

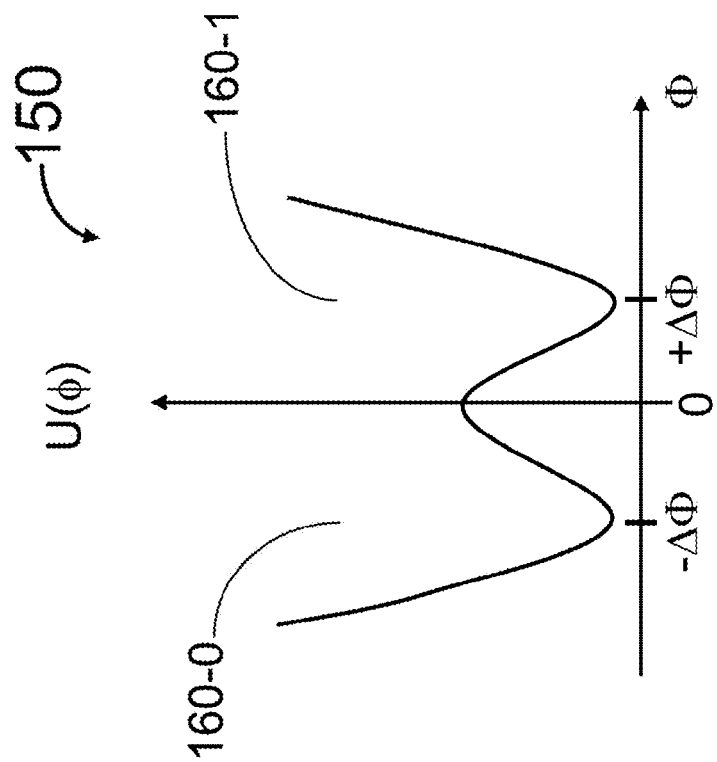
FIG. 1B
(Prior art)
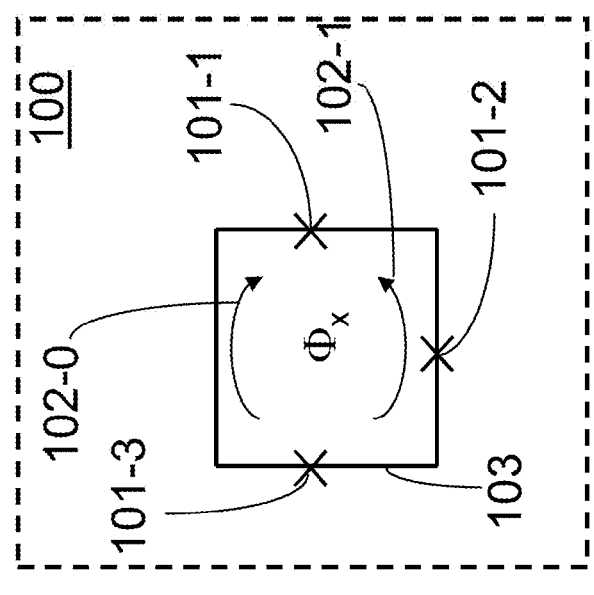
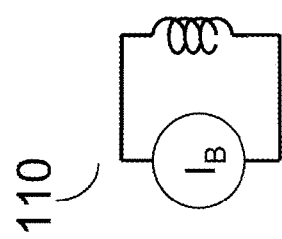
FIG. 1A
(Prior art)

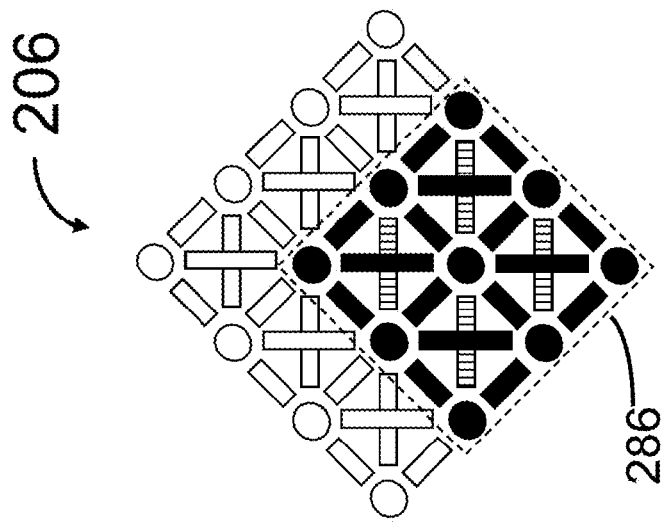
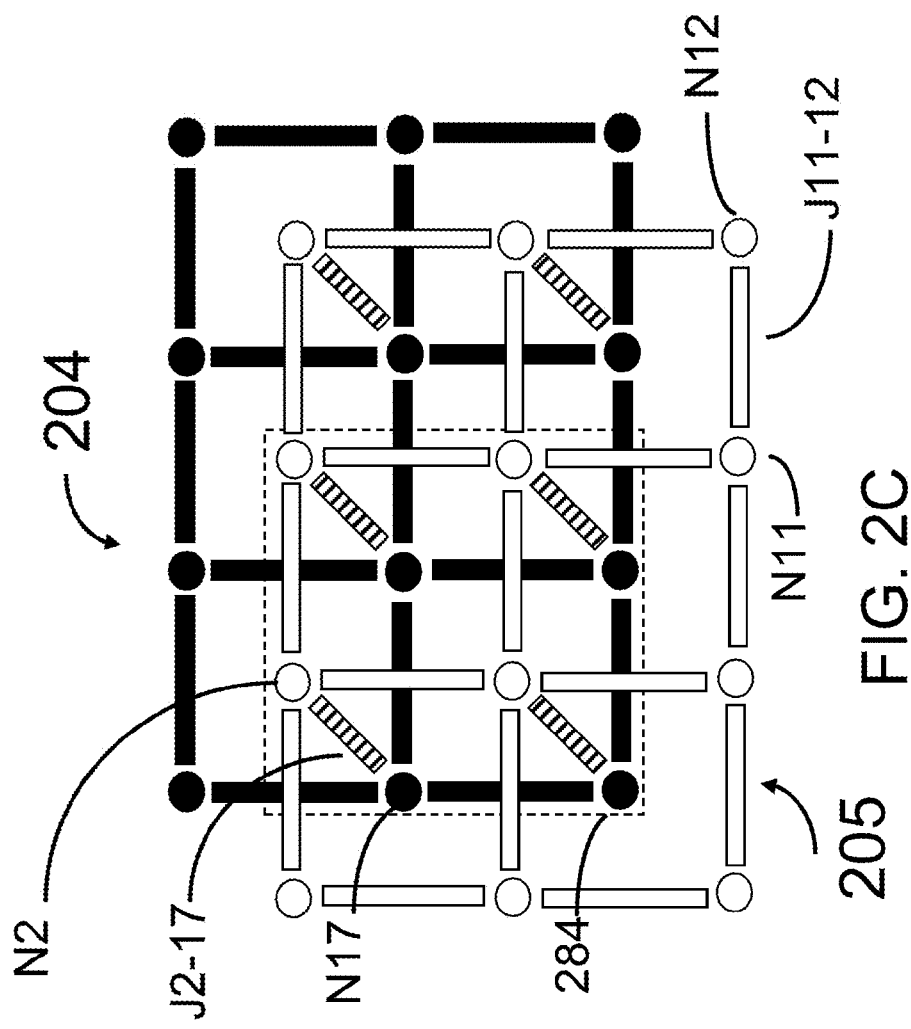
FIG. 2D
FIG. 2C

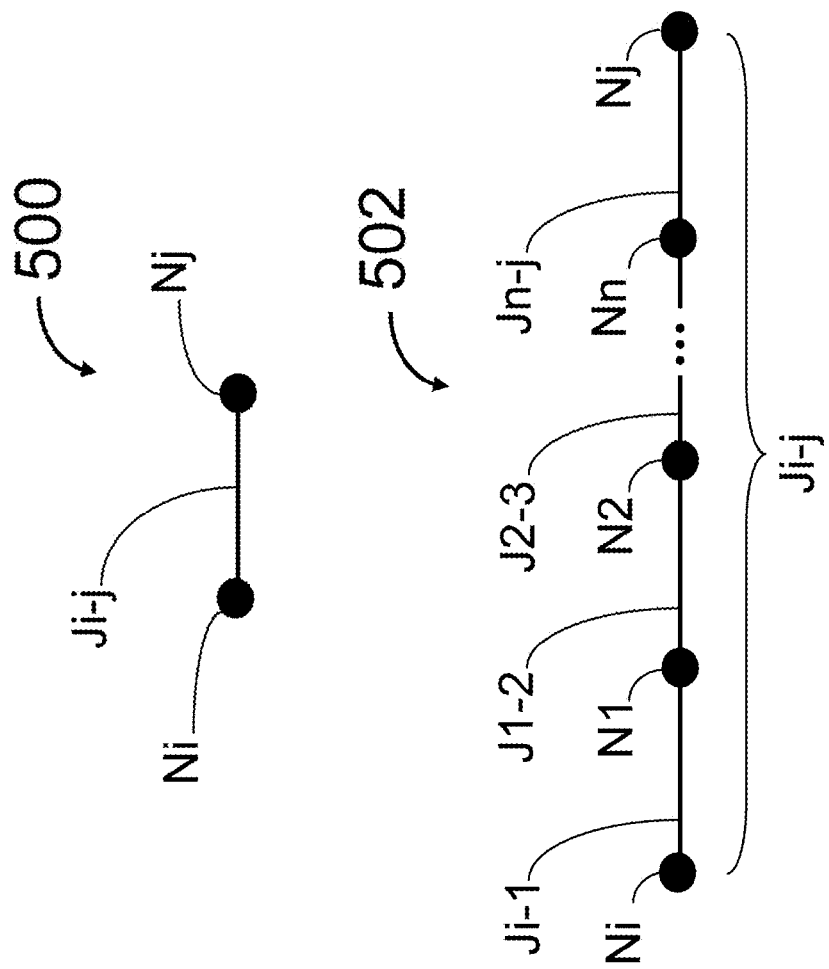

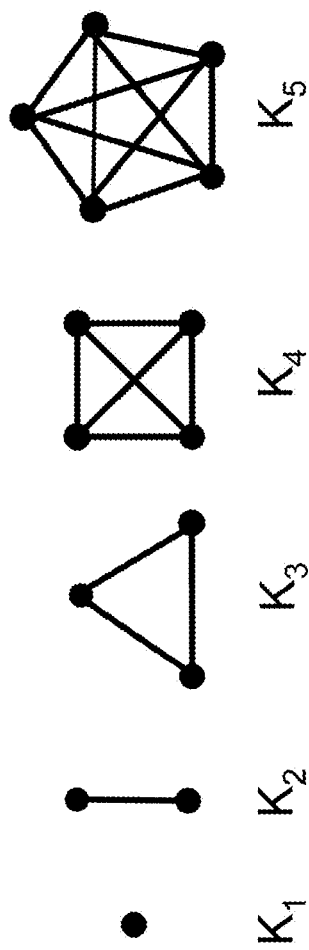
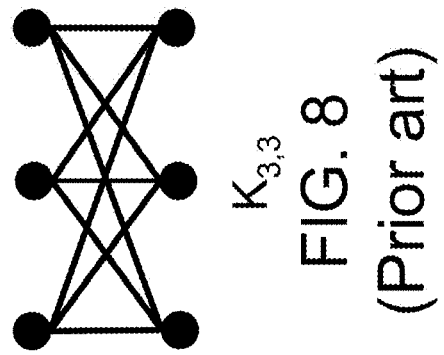
FIG. 7 (Prior art)
FIG. 8 (Prior art)

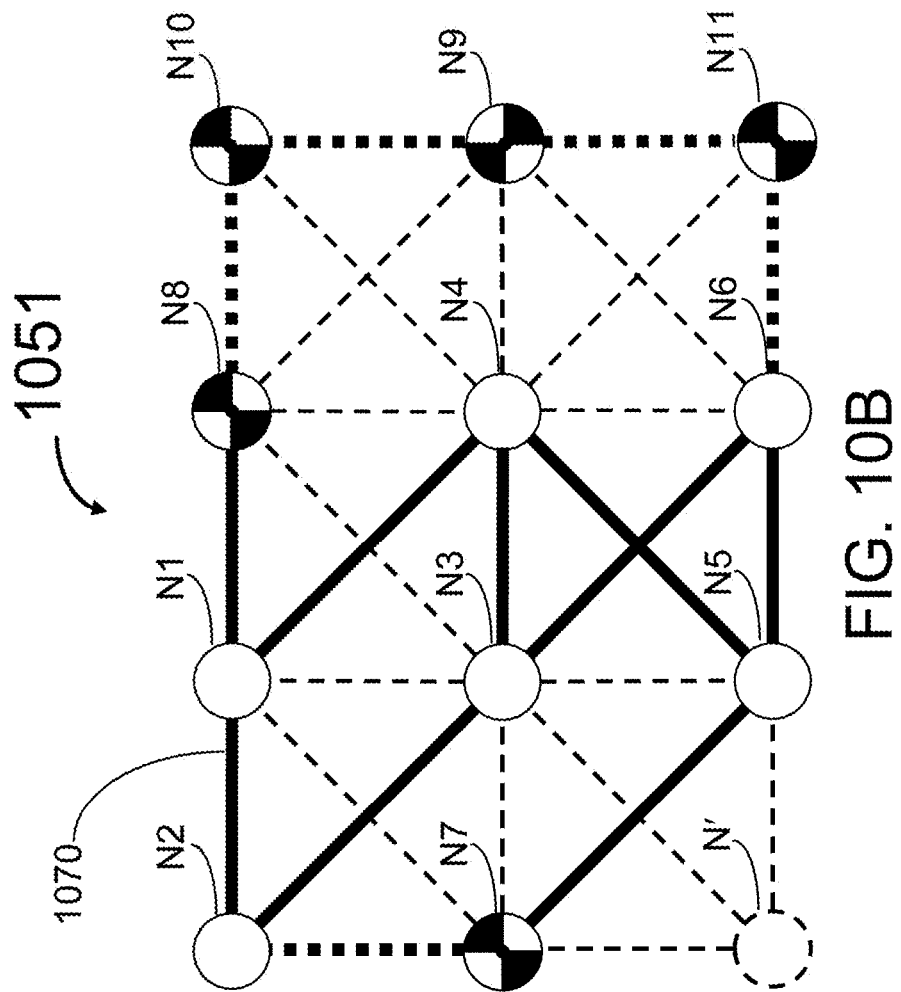
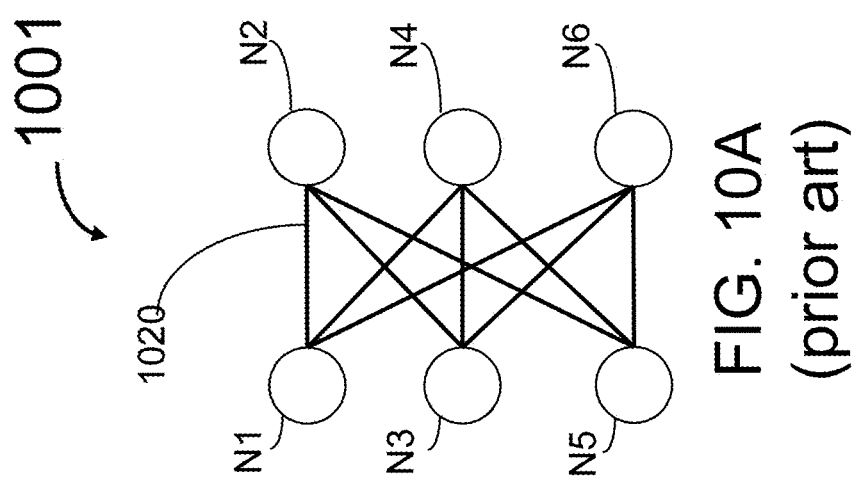
FIG. 10B
FIG. 10A (prior art)

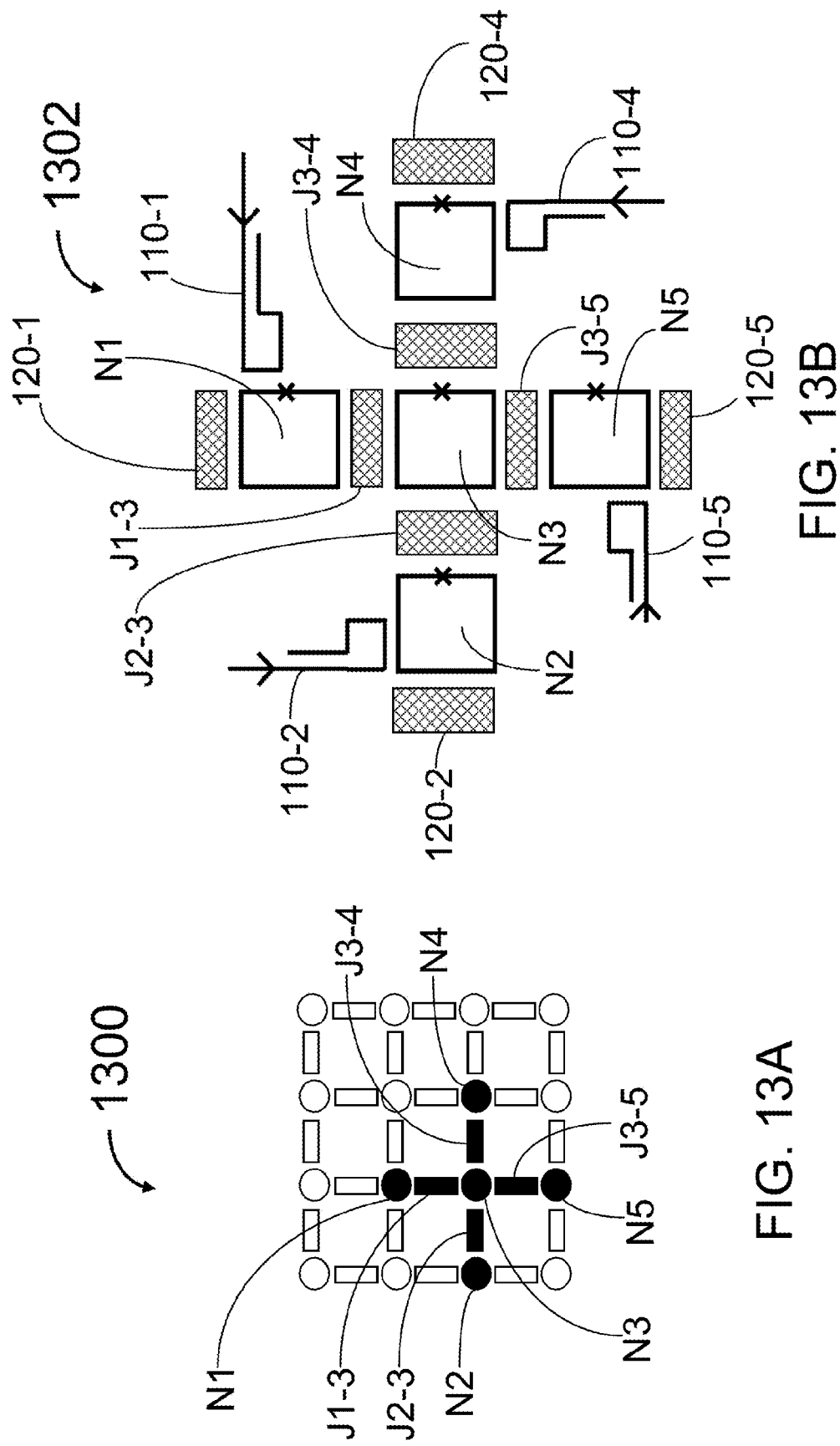

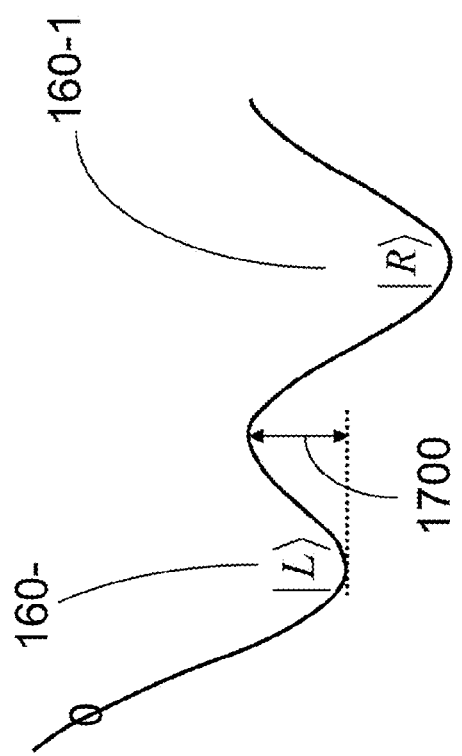
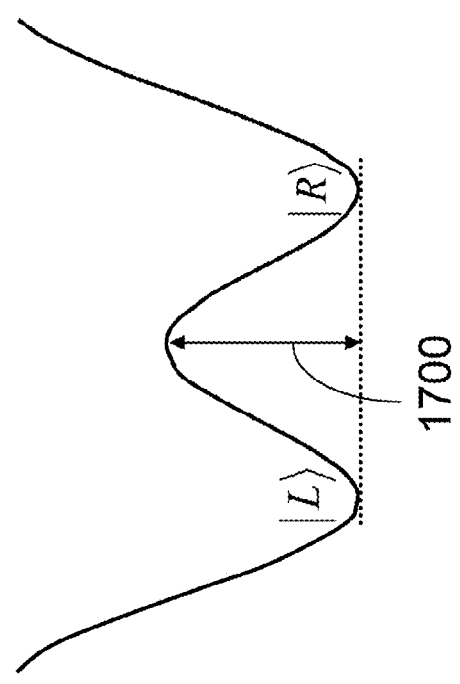
FIG 17A
FIG. 17B

ANALOG PROCESSOR COMPRISING QUANTUM DEVICES

BACKGROUND

Technical Field of the Invention

The present methods, articles and systems relate to analog processing and quantum computing devices.

Description of the Related Art 2.1 Analog Computing

Analog computing uses physical phenomena (mechanical, electrical, etc.) to model problems of interest using physical quantities (pressures, voltages, position, etc.) to represent the variables in the problem, where the problem is some abstract mathematical problem or some physics problem involving other physical quantities. At its very simplest, an analog system (e.g., analog computer) solves a problem by taking one or more input variables of the problem, representing them as physical quantities, and then evolving their states in accordance with the laws of physics. The answer to the problem is produced as a physical variable that can then be read out.

There are two advantages to analog systems. The first is that operations are performed in a truly parallel manner. Since operations are normally governed by the laws of physics, there is nothing in the physics of most analog systems that prohibits one operation in one part of the analog system from occurring at the same time as another operation in another part of the analog system. The second advantage is that analog systems do not involve time-domain computations, and thus do not require the use of clocks. Many analog systems evolve in real time which, for most physical applications, is faster than performing the same calculations on a digital computer.

Traditionally, analog systems use some physical quantity (e.g., voltage, pressure, temperature, etc.) to represent a continuous variable. This leads to problems in accuracy, because the precision of the answer to the problem is limited by the precision to which the continuous variable can be quantified. This is the case because analog systems normally use physical quantities to represent the variables in a problem and physical quantities found in nature are inherently continuous. Digital computers, on the other hand, involve discriminating between the possible bit values "0" and "1", for which there is an easy identification of the exact state. Analog systems are also often limited in the types of problems they can solve. For example, a sundial and a compass are both rudimentary analog computers. However, they can each only perform one operation, calculating the time based on the sun's position, and calculating the direction of the earth's magnetic field, respectively. A digital computer can be re-programmed to calculate both these problems using the same generic device. Analog systems are frequently more complex than digital computers. Further, the number of operations that an analog system can perform is often limited by the degree to which the circuits/devices can be duplicated.

Although digital computers are useful for solving many generic problems, there are still some problems whose solutions cannot be computed efficiently on a conventional digital computer. In other words, the time to find the solution to the problem does not scale polynomially with the size of the problem. In some cases, it is possible to parallelize the problem. However, such parallelization is often not practical from a cost perspective. Digital computers use a finite state machine approach. While the finite state machine approach works well for a broad class of computational problems, it imposes a fundamental limit on the complexity of the problems that can be solved. This is because the finite state machine approach uses a clock or timer to operate. Clocks implemented in current state of the art CMOS technology have a maximum clock rate (frequency) of about 5 GHz. In contrast, many analog systems do not require a clock. Thus answers to problems can evolve in a natural way in analog systems, often at a speed far greater, perhaps even exponentially greater, than their digital computing counterparts.

Digital computers have shown utility due to their low-power consumption, their discrete binary nature that makes state discrimination easy, and their ability to solve a broad array of general-purpose computational problems. However, many specific problems in quantum simulation, optimization, NP-hard and other NP-complete problems remain intractable on a digital computer. If the disadvantages of analog systems, such as their limited finite precision, could be overcome, an analog system could easily outperform a classical digital computer in solving important computational problems.

2.2 Complexity Classes

Computer scientists concerned with complexity routinely use the definitions of different complexity classes. The number of complexity classes is ever changing, as new ones are defined and existing ones merge through advancements made in computer science. The complexity classes known as polynomial-time (P), non-deterministic polynomial-time (NP), NP-complete (NPC), and NP-hard (NPH) are all classes of decision problems. Decision problems have binary outcomes.

Problems in NP are computational problems for which there exists polynomial time verification. That is, it takes no more than polynomial time (class P) in the size of the problem to verify a potential solution. It may take more than polynomial time to create a potential solution. For NP-hard problems it may take longer to verify a potential solution.

Problems in NPC can be defined as problems in NP that have been shown to be equivalent to, or harder to solve, than a known problem in NPC. Equivalently, the problems in NPC are problems in NP that are also in NPH. This can be expressed as NPC=NP∩NPH.

A problem is equivalent, or harder to solve, than a known problem in NPC if there exists a polynomial time reduction to the instant problem from the known problem in NPC. Reduction can be regarded as a generalization of mapping. The mappings can be one to one functions, many to one functions, or make use of oracles, etc. The concepts of complexity classes and how they define the intractability of certain computational problems is found in, for example, Garey and Johnson, 1979, *Computers and Intractability: A Guide to the Theory of NP-Completeness*, Freeman, San Francisco, ISBN: 0716710455 (hereinafter "Garey and Johnson"). Also see, Cormen, Leiserson, and Rivest, 1990, *Introduction to Algorithms*, MIT Press, Cambridge, ISBN: 0262530910.

Often decision problems have a related optimization problem that is solved to determine the correct decision. Efficiency in solving a decision-based NP-complete problem will lead to efficiency in solving the corresponding optimization-based problem. This is generally true of any problem in NP. Often it is the optimization-based problem for which a solution is sought.

2.3 Quantum Devices

Quantum computing is a relatively new method of computing that uses quantum devices to take advantage of quantum effects, such as superposition of basis states and the entanglement of quantum devices, to perform certain computations faster than a classical digital computer. In digital computers, information is stored in bits, which can be in either a "0" or "1" state. For example, a bit may represent a logical "0" with a low voltage and a logical "1" with a high voltage. In contrast to the bits of a digital computer, a quantum computer stores information as qubits, a type of quantum device, in which data can be in either a "0" or "1" state, or in any superposition of these states, $$\alpha|0\rangle+\beta|1\rangle \qquad (1)$$

In accordance with the terminology of equation (1), the "0" state of a digital computer is analogous to the $|0\rangle$ basis state of a qubit. Likewise, the "1" state of a digital computer is analogous to the $|1\rangle$ basis state of a qubit. In accordance with equation (1), a qubit permits a superposition of qubit basis states, where the qubit has a certain probability of being in either the $|0\rangle$ or $|1\rangle$ states. The term $|\alpha|^2$ is the probability of being in the $|0\rangle$ state and the term $|\beta|^2$ is the probability of being in the $|1\rangle$ state, where $|\alpha|^2+|\beta|^2=1$. Clearly, the continuous variables $\alpha$ and $\beta$ contain a great deal more information than the states of bits in a digital computer, which are simply 0s or 1s. A qubit's state can be represented as the vector, $$\begin{bmatrix} \alpha \\ \beta \end{bmatrix}. \qquad (2)$$

Although the qubit can be in a linear combination (or superposition) of states, it can only be read-out or measured as being in the $|0\rangle$ or $|1\rangle$ state. Quantum devices exhibit quantum behavior such as quantum tunneling between quantum basis states, superposition of basis states, entanglement of qubits, coherence, and the demonstration of both wave-like and particle-like properties. In a standard model of quantum computation (also known as the circuit model of quantum computation) quantum gate operations are performed on qubits in a quantum computing device in the time domain. In other words, individual gates operate on the state of one or more qubits in the quantum computing device for a predetermined period of time in order to effect a quantum computation. Gates are represented by matrices that are matrix multiplied with the state vector of the operated on qubits. The most elementary single-qubit gates are the Pauli matrices:

$$X \equiv \begin{bmatrix} 0 & 1 \\ 1 & 0 \end{bmatrix},$$

$$Y \equiv \begin{bmatrix} 0 & -i \\ i & 0 \end{bmatrix}, \qquad (3)$$

$$Z \equiv \begin{bmatrix} 1 & 0 \\ 0 & -1 \end{bmatrix}.$$

Other single qubit gates include the Hadamard gate, the phase gate, and the $\pi/8$ gate. See, for example, Nielson and Chuang, 2000, *Quantum Computation and Quantum Information*, Cambridge University Press, Cambridge, pp. 174-177.

Two qubits coupled together also obey superposition:

$$\alpha_{00}|00\rangle+\alpha_{01}|01\rangle+\alpha_{10}|10\rangle+\alpha_{11}|11\rangle. \qquad (4)$$

The state of a two-qubit system is represented by a four-element vector and two-qubit gate operations are represented by 4×4 matrices. An n qubit system is therefore represented by a $2^n$ vector of continuous variables. A subset of elementary single gate operations, such as those shown in (3), and one or more two-qubit gate operations form a set of gates which are said to be universal for quantum computation. A universal set of quantum operations is any set of quantum operations that permits all possible quantum computations.

2.4 Requirements for Quantum Computing

Generally speaking, a qubit is a well-defined physical structure that (i) has a plurality of quantum states, (ii) can be coherently isolated from its environment and (iii) permits quantum tunneling between two or more quantum states associated with the qubit. See for example, Mooji et al., 1999, *Science* 285, p. 1036 (hereinafter "Mooji"), which is hereby incorporated by reference herein in its entirety. A survey of the current physical systems from which qubits can be formed is found in Braunstein and Lo (eds.), 2001, *Scalable Quantum Computers*, Wiley-VCH, Berlin (hereinafter "Braunstein and Lo").

In order for a physical system to behave as a qubit a number of requirements must be satisfied. See DiVincenzo in Braunstein and Lo, Chapter 1. These requirements include the need for the physical system (qubit) to be scalable. In other words, it must be possible to combine a reasonable number of the qubits in a coherent fashion. Associated with scalability is the need to eliminate qubit decoherence. Also required for a qubit to be useful in quantum computing, is the ability to perform operations that initialize, control and couple the qubit. Control of a qubit includes performing single qubit operations as well as operations on two or more qubits. In order to support quantum computing, this set of operations needs to be a universal set. Many sets of gates are universal, see, for example, Barenco et al., 1995, *Physical Review A* 52, p. 3457, which is hereby incorporated by reference herein in its entirety. Yet another requirement for quantum computing is the need to be able to measure the state of the qubit in order to perform computing operations and retrieve information. These requirements were developed for the circuit model of quantum computation and may be relaxed for other models.

2.5 Superconducting Qubits

Several quantum computing hardware proposals have been made. Of these hardware proposals, the most scalable physical systems appear to be those that are superconducting structures. Superconducting material is material that has no electrical resistance below critical levels of current, magnetic field and temperature. Josephson junctions are examples of such structures.

There are two principal means to realize superconducting qubits. One means corresponds to the limits of well-defined charge (charge qubit). The other means corresponds to the limits of well-defined phase (phase/flux qubit). Phase and charge are related variables that, according to basic quantum principles, are canonical conjugates of one another. The division of the two classes of devices is outlined in Makhlin et al., 2001, *Reviews of Modern Physics* 73, pp. 357-400 (hereinafter "Makhlin"), which is hereby incorporated herein by reference in its entirety. Superconducting qubits include devices that are well known in the art, such as Josephson junction qubits. See, for example, Barone and Paternò, 1982, *Physics and Applications of the Josephson Effect*, John Wiley and Sons, New York; Martinis et al., 2002, *Physical Review Letters* 89, 117901, which is hereby incorporated herein by reference in its entirety; and Han et al., 2001, *Science* 293, p. 1457, which is hereby incorporated herein by reference in its entirety.

2.5.1 Flux Qubits

One type of flux qubit is the persistent current qubit. See Mooji and Orlando et al., 1999, *Physical Review B* 60, 15398-15413 (hereinafter "Orlando"), which is hereby incorporated herein by reference in its entirety. The superconducting phase qubit is well known and has demonstrated long coherence times. See, for example, Orlando and Il'ichev et al., 2003, *Physical Review Letters* 91, 097906 (hereinafter "Il'ichev"), which is hereby incorporated herein by reference in its entirety. Some other types of phase qubits comprise superconducting loops having more or less than three Josephson junctions. See, e.g., G. Blatter et al., 2001, *Physical Review B*, 63, 174511; and Friedman et al., 2000, *Nature* 406, 43 (hereinafter "Friedman 2000"), each of which is hereby incorporated herein by reference in its entirety. For more details on flux qubits, see U.S. Pat. No. 6,960,780 titled "Resonant controlled qubit system"; U.S. Pat. No. 6,897,468 titled "Resonant controlled qubit system"; U.S. Pat. No. 6,784,451 titled "Multi junction phase qubit"; U.S. Pat. No. 6,885,325 titled "Sub-flux quantum generator"; U.S. Pat. No. 6,670,630 titled "Quantum phase-charge coupled device"; U.S. Pat. No. 6,822,255 titled "Finger squid qubit device"; U.S. Pat. No. 6,979,836 titled "Superconducting low inductance qubit"; US Patent Application Publication Nos. 2004-0140537 titled "Extra-substrate control system"; 2004-0119061 titled "Methods for single qubit gate teleportation"; 2004-0016918 titled "System and method for controlling superconducting qubits; 2004-0000666 titled "Encoding and error suppression for superconducting quantum computers"; 2003-0173498 titled "Quantum phase-charge coupled device"; 2003-0169041 titled "Quantum computing integrated development environment"; 2003-0121028 titled "Quantum computing integrated development environment"; 2003-0107033 titled "Trilayer heterostructure junctions"; and 2002-0121636 titled "Quantum bit with a multi-terminal junction and loop with a phase shift" each of which is hereby incorporated herein by reference in its entirety.

FIG. 1A illustrates a superconducting phase qubit 100. Phase qubit 100 comprises a loop 103 of superconducting material interrupted by Josephson junctions 101-1, 101-2, and 101-3. Josephson junctions are typically formed using standard fabrication processes, generally involving material deposition and lithography stages. See, e.g., Madou, 2002, *Fundamentals of Microfabrication, Second Edition*, CRC Press; Van Zant, 2000, *Microchip Fabrication*, Fourth Edition, McGraw-Hill, New York; Levinson, 2001, *Principles of Lithography*, The International Society for Optical Engineering, Bellingham Wash.; and Choudhury, 1997, *Handbook of Microlithography, Micromachining and Microfabrication Volume 1: Microlithography*, The International Society for Optical Engineering, Bellingham Wash. Methods of fabricating Josephson junctions are described, for example, in Ramos et al., 2001, *IEEE Transactions on Applied Superconductivity* 11, p. 998. Common substrates include silicon, silicon oxide, or sapphire, for example. Josephson junctions 101 can also include insulating materials such as aluminum oxide, for example. Examples of superconducting materials useful for forming superconducting loop 103 are aluminum and niobium. Josephson junctions 101 have sizes ranging from about 10 nanometers (nm) to about 10 micrometers (μm). One or more of the Josephson junctions 101 have parameters, such as the size of the junction, the junction surface area, the Josephson energy or the charging energy, that differ from the other Josephson junctions in phase qubit 100. The difference between any two Josephson junctions 101 in phase qubit 100 is characterized by a coefficient, termed α, which typically ranges from about 0.5 to about 1.3, where α=1 represents junctions with equivalent parameters. In some instances, the term a for a pair of Josephson junctions in the phase qubit is the ratio of the critical current of the respective Josephson junctions. The critical current of a Josephson junction is the current through the junction at which the junction is no longer superconducting. That is, below the critical current, the junction is superconducting, and above the critical current, the junction is not superconducting. Thus, for example, the term a for junctions 101-1 and 101-2 is defined as the ratio between the critical current of junction 101-1 and the critical current of junction 101-2.

Referring to FIG. 1A, a bias source 110 is inductively coupled to phase qubit 100. Bias source 110 is used to thread a magnetic flux $\Phi_x$ through phase qubit 100 to provide control of the state of the phase qubit. Phase qubit 100 typically operates with a magnetic flux bias $\Phi_x$ ranging between about $0.2 \cdot \phi_0$ to about $0.8 \cdot \Phi_0$, where $\Phi_0$ is the flux quantum.

Phase qubit 100 has a simplified two-dimensional potential with respect to the phase across Josephson junctions 101. Phase qubit 100 is typically biased with a magnetic flux $\Phi_x$, such that the two-dimensional potential profile includes regions of local energy minima, where the local energy minima are separated from each other by small energy barriers and are separated from other regions by large energy barriers. This potential is a double well potential 150 (FIG. 1B) that includes a left well 160-0 and a right well 160-1, respectively representing clockwise 102-0 and counterclockwise 102-1 circulating supercurrent in phase qubit 100 of FIG. 1A. A double well potential 150 can be formed when a flux bias of about $0.5 \cdot \Phi_0$ is applied.

When wells 160-0 and 160-1 are at or near degeneracy, meaning that they are at the same or nearly the same energy potential as illustrated in FIG. 1B, the quantum state of phase qubit 100 becomes a coherent superposition of the phase or basis states and the device can be operated as a phase qubit. The point at or near degeneracy is herein referred to as the point of computational operation of phase qubit 100. During computational operation of phase qubit 100, controllable quantum effects can be used to process the quantum information stored in the phase states according to the rules of quantum computing. Since the quantum information stored and processed in the phase qubit is in the phase basis, it is insensitive to noise in the charge basis. Il'ichev et at (Il'ichev) used a three-Josephson junction flux qubit, coupled to a high-quality tank circuit, to perform a continuous observation of Rabi oscillations.

There are many problems with the standard model of quantum computation that make it a challenging feat of science and engineering. Quantum computing involves coherently processing quantum information. This requires sufficiently long decoherence times in the qubits, as well as immunity to noise and errors. Decoherence makes time-domain gate-level standard model quantum computation difficult. It is therefore desirable to harness quantum effects such as incoherent tunneling to solve useful problems, thus overcoming the challenges of standard model quantum computation.

BRIEF SUMMARY (i) One aspect of the present method, articles and systems provides a computational system comprising an analog (quantum) processor. The quantum processor comprises a plurality of quantum devices forming nodes of a lattice, the quantum devices having first and second basis states and comprising loops of superconducting material interrupted by Josephson junction(s). The quantum processor also comprises a plurality of coupling devices coupling the quantum devices together in nearest-neighbor and/or next-nearest neighbor configuration(s).

(ii) Another aspect of the present methods, articles and systems provides a method of determining a result of a computational problem using a quantum processor comprising a plurality of quantum devices and plurality of coupling devices coupling the quantum devices together. The method includes initializing the quantum processor to an initial state by setting a state of each quantum device in the plurality of quantum devices and a coupling strength of each coupling device in the plurality of coupling devices, allowing the quantum processor to evolve to a final state approximating a natural ground state of the computational problem; and reading out a final state of one or more quantum devices in the plurality of quantum devices thereby determining the result of the computational problem.

(iii) In still another aspect of the present methods, articles and systems, a computer system comprising a central processing unit and a memory coupled to the central processing unit is provided for determining a result of a computational problem. The memory comprises a user interface module comprising instructions for defining the computational problem, a mapper module comprising instructions for generating a mapping of the computational problem, and an analog processor interface module. The analog processor interface module comprises instructions for transmitting the mapping to an analog processor and instructions for receiving a result, responsive to the mapping, from the analog processor. The analog processor comprises a plurality of quantum devices and a plurality of coupling devices and the mapping includes initialization values for each quantum device in the plurality of quantum devices and initialization values for each coupling device in the plurality of coupling devices. The coupling devices couple the quantum devices to their nearest neighbor(s) and/or their next-nearest neighbor(s).

(iv) Yet another aspect of the present methods, articles and systems provides a computer program product for use in conjunction with a digital computer system. The computer program product comprises a computer readable storage medium and a computer program mechanism embedded therein, with the computer program mechanism comprising a user interface module comprising instructions for defining a computational problem, a mapper module comprising instructions for generating a mapping of the computational problem and an analog processor interface module comprising instructions for transmitting the mapping to an analog processor and instructions for receiving a result, responsive to the mapping, from the analog processor. The analog processor comprises a plurality of quantum devices and a plurality of coupling devices, the mapping includes initialization values for each quantum device in the plurality of quantum devices and initialization values for each coupling device in the plurality of coupling devices, and the coupling devices couple the quantum devices to their nearest neighbor(s) and/or their next-nearest neighbor(s).

(v) In still another aspect of the present methods, articles and systems, a quantum processor is provided. The quantum processor comprises a plurality of quantum devices arranged in a lattice, a first plurality of coupling devices and a second plurality of coupling devices. A coupling device in the first plurality of coupling devices couples a first quantum device and a second quantum device that are nearest neighbors in the lattice, and a coupling device in the second plurality of coupling devices couples a third quantum device and a fourth quantum device that are next nearest neighbors in the lattice.

(vi) In yet another aspect of the present methods, articles and systems, a quantum processor comprising a plurality of quantum devices is provided, along with a first plurality of coupling devices, a second plurality of coupling devices, a read out device coupled to at least one quantum device, and a local bias device coupled to at least one quantum device. The plurality of quantum devices and the first plurality of coupling devices form a planar rectangular array having a diagonal, and at least one coupling device in the first plurality of coupling devices couples a first quantum device and second quantum device with a coupling strength having a value in the range between a minimum negative coupling strength and a maximum positive coupling strength. At least one coupling device in the second plurality of coupling devices couples a third quantum device and a fourth quantum device arranged along the diagonal of the array with a coupling strength having a value in the range between a minimum negative coupling strength and a zero coupling strength.

(vii) In still another aspect of the present methods, articles and systems, a computational system comprising a quantum processor is provided. The quantum processor comprises a plurality of qubit means forming nodes of a lattice, and a plurality of coupling means. A first coupling means in the plurality of coupling means couples a first qubit means to a second qubit means, the first qubit means and the second qubit means being in either a nearest-neighbor or a next-nearest neighbor configuration.

(viii) In yet another aspect of the present methods, articles and systems, a quantum processor comprising a plurality of qubit means arranged in a lattice, a first plurality of coupling means and a second plurality of coupling means is provided. A first coupling means in the first plurality of coupling means couples a first qubit means and a second qubit means, the first qubit means and the second qubit means being configured as nearest neighbors in the lattice, and a first coupling means in the second plurality of coupling means couples a third qubit means and a fourth qubit means, the third qubit means and the fourth qubit means being configured as next nearest neighbors in the lattice.

(ix) In yet another aspect of the present methods, articles and systems, a method of determining a result for a computational problem using a quantum processor is provided. The quantum processor comprises a plurality of quantum devices and a plurality of coupling devices, each coupling device coupling a pair of quantum devices. The method comprises initializing the quantum processor to an initial state by setting a state of each quantum device and setting a coupling strength of each coupling device, allowing the quantum processor to evolve to a final state approximating a natural ground state of the computational problem, reading out a final state of at least one quantum device thereby determining the result for the computational problem, generating a carrier wave embodying a data signal comprising the result of the computational problem.

(x) In still another aspect of the present methods, articles and systems, a computer system is provided comprising means for inputting a P, NP, NP-Hard and NP-Complete computational problem to be solved, means for mapping the computational problem onto a quantum processor comprising qubit means and means for coupling nearest-neighbor and next-nearest neighbor qubit means, means for obtaining a solution to the computational problem using the quantum processor, means for outputting the solution of the computational problem, and means for transmitting the solution as a data signal embodied in a carrier wave.

(xi) In still another aspect of the present methods, articles and systems, a digital signal embodied on a carrier wave is provided comprising a respective value for each node in a plurality of nodes. The plurality of nodes are at least two nodes in a lattice of nodes in a quantum processor. Each node in the lattice of nodes is a quantum device. A value of at least one node in the plurality of nodes individually or collectively represents a solution to a computational problem that has been solved by evolving the quantum processor at a time after a graph representing the computational problem has been mapped onto at least a portion of the lattice.

(xii) In still another aspect of the present methods, articles and systems, a digital signal embodied on a carrier wave is provided comprising an answer to a computational problem that was determined by evaluating a value of each node in a plurality of nodes. The plurality of nodes are at least two nodes in a lattice of nodes in a quantum processor, and each node in the lattice of nodes is a quantum device. A value of at least one node in the plurality of nodes is determined after evolving the quantum processor at a time after a graph representing the computational problem has been mapped onto at least a portion of the lattice.

(xiii) In still another aspect of the present methods, articles and systems, a digital signal embodied on a carrier wave is provided comprising a graph of a computational problem to be solved by a quantum processor in which the quantum processor comprises a lattice of quantum devices. The graph of the computational problem to be solved comprises a plurality of nodes and, for each respective node in the plurality of nodes, an initial value for the respective node and a corresponding coupling constant between the respective node and another node in the plurality of nodes. The graph of the computational problem to be solved is configured so that it can be mapped to the lattice of the quantum processor.

(xiv) In still another aspect of the present methods, articles and systems, a digital signal embodied on a carrier wave is provided comprising a computational problem to be solved by a quantum processor. The quantum processor comprises a lattice of quantum devices. The computational problem to be solved is converted to a graph comprising a plurality of nodes and, for each respective node in the plurality of nodes, an initial value for the respective node and a corresponding coupling constant between the respective node and another node in the plurality of nodes. The graph of the computational problem to be solved is configured so that it can be mapped to the lattice of the quantum processor.

(xv) In still another aspect of the present methods, articles and systems, a graphical user interface is provided, the graphical user interface is for obtaining a solution to a computational problem and comprises a first display field and a second display field. The first display field indicates when a digital signal embodied on a carrier wave comprising a respective value for each node in a plurality of nodes has been received. The plurality of nodes are at least two nodes in a lattice of nodes in a quantum processor, and each node in the lattice of nodes is a quantum device. A value of at least one node in the plurality of nodes individually or collectively represents the solution to the computational problem that has been solved by evolving the quantum processor at a time after a graph representing the computational problem has been mapped onto at least a portion of the lattice. The second display field displays the solution to the computational problem.

(xvi) In still another aspect of the present methods, articles and systems, a graphical user interface is provided, the graphical user interface is for obtaining a solution to a computational problem and comprises a first display field and a second display field. The first display field indicates when a digital signal embodied on a carrier wave comprising an answer to the computational problem has been received. The answer to the computational problem is determined by evaluating a value of at least one node in a plurality of nodes. The plurality of nodes are at least two nodes in a lattice of nodes in a quantum processor, and each node in the lattice of nodes is a quantum device. The value of at least one node in the plurality of nodes is determined after evolving the quantum processor at a time after a graph representing the computational problem has been mapped onto at least a portion of the lattice. The second display field displays the solution to the computational problem.

(xvii) In yet another aspect of the present methods, articles and systems, a graphical user interface is provided, the graphical user interface is for obtaining a solution to a computational problem and comprises a first display field and a second display field. The first display field indicates when a digital signal embodied on a carrier wave comprising the computational problem to be solved by a quantum processor has been generated. The quantum processor comprises a lattice of quantum devices. The computational problem to be solved comprises a plurality of nodes and, for each respective node in the plurality of nodes, an initial value for the respective node and a corresponding coupling constant between the respective node and another node in the plurality of nodes. The computational problem to be solved is configured so that it can be mapped to the lattice of the quantum processor. The second display field displays the solution to the computational problem after it has been received.

(xviii) In yet another aspect of the present methods, articles and systems, a computational system is provided. The computational system comprises a local computer, a remote computer, and a remote quantum processor in communication with the remote computer. The quantum processor comprises a plurality of quantum devices, where each quantum device in the plurality of quantum devices is a node of a lattice, and where a first quantum device in the plurality of quantum devices has a first basis state and a second basis state. The quantum processor further comprises a plurality of coupling devices, where a first coupling device in the plurality of coupling devices couples the first quantum device in the plurality of quantum devices to a second quantum device in the plurality of quantum devices, where a configuration of the first quantum device and the second quantum device in the lattice is selected from the group consisting of a nearest-neighbor configuration and a next-nearest neighbor configuration. The local computer is configured to send a computational problem to be solved to the remote computer. The remote computer is configured to send an answer to the computational problem to the local computer.

(xix) In yet another aspect of the present methods, articles and systems, a computer system for determining a result of a computational problem is provided. The computer system comprises a local computer, a remote computer, and an analog processor. The local computer comprises a central processing unit and a memory, coupled to the central processing unit. The memory of the local computer stores a user interface module comprising instructions for defining the computational problem, a mapper module comprising instructions for generating a mapping of the computational problem, and a transmit module comprising instructions for sending the mapping to the remote computer. The remote computer comprises a central processing unit and a memory, coupled to the central processing unit. The memory of the remote computer stores a receive module comprising instructions for receiving the mapping from the local computer, and an analog processor interface module comprising instructions for transmitting the mapping to the analog processor. The analog processor comprises a plurality of quantum devices and a plurality of coupling devices. The mapping includes initialization values for at least one of the quantum devices in the plurality of quantum devices and initialization values for at least one of the coupling devices in the plurality of coupling devices. A coupling device in the plurality of coupling devices couples a corresponding respective quantum device in the plurality of quantum devices to at least one of a nearest neighbor of the respective quantum device and a next-nearest neighbor of the respective quantum device.

(xx) In yet another aspect of the present methods, articles and systems, a computer system for determining a result of a computational problem is provided. The computer system comprises a local computer, a remote computer, and an analog processor. The local computer comprises a central processing unit and a memory, coupled to the central processing unit. The memory of the local computer comprises instructions for defining the computational problem, and a transmit module comprising instructions for sending the computational problem to the remote computer. The remote computer comprises a central processing unit and a memory, coupled to the central processing unit. The memory of the remote computer stores a receive module comprising instructions for receiving the computational problem from the local computer, a mapper module comprising instructions for generating a mapping of the computational problem, and an analog processor interface module comprising instructions for transmitting the mapping to the analog processor. The analog processor comprises a plurality of quantum devices and a plurality of coupling devices. The mapping includes initialization values for at least one of the quantum devices in the plurality of quantum devices and initialization values for at least one of the coupling devices in the plurality of coupling devices, where a coupling device in the plurality of coupling devices couples a corresponding respective quantum device in the plurality of quantum devices to at least one of a nearest neighbor of the respective quantum device and a next-nearest neighbor of the respective quantum device.

BRIEF DESCRIPTION OF THE SEVERAL VIEWS OF THE DRAWINGS

FIGS. 1A and 1B illustrate a flux qubit and a corresponding double well potential profile in accordance with the prior art.

FIG. 2C illustrates another lattice in accordance with an embodiment of the present methods, articles and systems.

FIG. 2D illustrates the lattice of FIG. 2B rotated by 45° in accordance with an embodiment of the present methods, articles and systems.

FIG. 5 illustrates an embodiment of the methods, articles and systems for making multiple coupling devices and nodes equivalent to a single coupling device.

FIG. 7 illustrates the first five complete graphs, $K_1$ through $K_5$, in accordance with the prior art.

FIG. 8 illustrates a $K_{3,3}$ bipartite graph in accordance with the prior art.

FIGS. 10A and 10B illustrate an embodiment of the methods, articles and systems for mapping a non-planar graph to the corresponding lattice-based analog with next-nearest neighbor coupling.

FIGS. 13A and 13B illustrate another embodiment of the methods, articles and systems for mapping a lattice-based graph to an integrated circuit.

FIGS. 17A and 17B illustrate embodiments of the methods, articles and systems for controlling a double well potential.

Figure 2B:
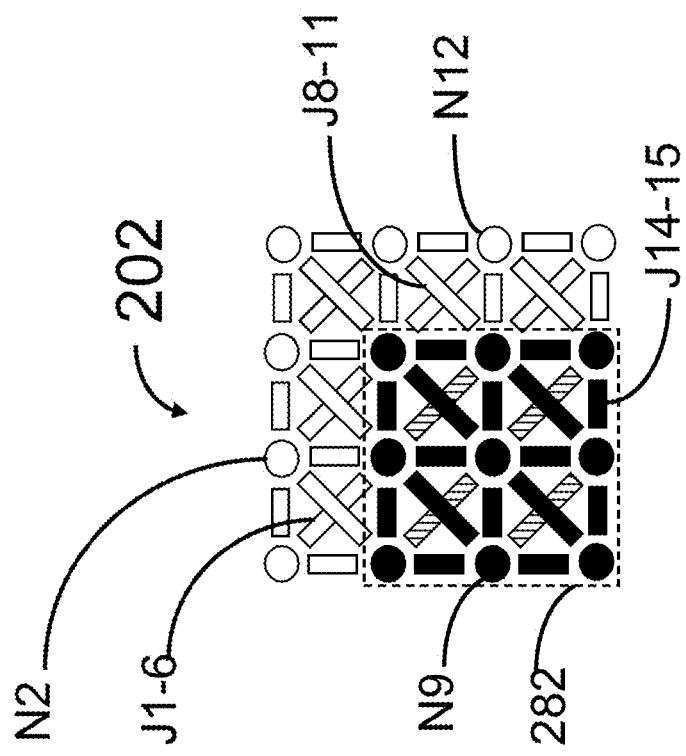
FIG. 2B illustrates a lattice with orthogonal and diagonal coupling between nodes in accordance with an embodiment of the present methods, articles and systems.

In the figures, identical reference numbers identify similar elements or acts. The sizes and relative positions of elements in the figures are not necessarily drawn to scale. For example, the shapes of various elements and angles are not drawn to scale, and some of these elements are arbitrarily enlarged and positioned to improve legibility. Further, the particular shapes of the elements as drawn are not intended to convey any information regarding the actual shape of the particular elements and have been solely selected for ease of recognition in the figures. Furthermore, while the figures may show specific layouts, one skilled in the art will appreciate that variations in design, layout, and fabrication are possible and the shown layouts are not to be construed as limiting the layout of the present methods, articles and systems.

DETAILED DESCRIPTION

In the following description, certain specific details are set forth in order to provide a thorough understanding of various embodiments of the invention. However, one skilled in the art will understand that the invention may be practiced without these details. In other instances, well-known structures associated with analog processors, such as quantum devices, coupling devices and control systems including microprocessors and drive circuitry have not been shown or described in detail to avoid unnecessarily obscuring descriptions of the embodiments of the invention. Unless the context requires otherwise, throughout the specification and claims which follow, the word "comprise" and variations thereof, such as, "comprises" and "comprising" are to be construed in an open, inclusive sense, that is as "including, but not limited to." Reference throughout this specification to "one embodiment", "an embodiment", "one alternative" or "an alternative" means that a particular feature, structure or characteristic described is included in at least one embodiment of the present invention. Thus, the appearances of such phrases in various places throughout this specification are not necessarily all referring to the same embodiment. Furthermore, the particular features, structures, or characteristics may be combined in any suitable manner in one or more embodiments. The headings provided herein are for convenience only and do not interpret the scope or meaning of the claimed invention.

In accordance with the present methods, articles and systems, analog processors are described. In some embodiments, the analog processor comprises a plurality of quantum devices arranged in a lattice and a plurality of coupling devices that couple the quantum devices together. In some embodiments, the coupling devices couple individual quantum devices in the plurality of quantum devices to their nearest neighbors and/or their next-nearest neighbors. In some embodiments, the analog processor is capable of approximating the solution to problems that fall within the NP (nondeterministic polynomial time) class of problems.

The NP class of problems are those that are verifiable by a nondeterministic Turing machine in polynomial time. Examples of NP class problems include, but are not limited to, the Ising Spin Glass (ISG) problem, Maximum Independent Set, Max Clique, Max Cut, Vertex Cover, Traveling Salesperson (TSP) problem, k-SAT, integer linear programming, and finding the ground state of an unbiased, non-tunneling spin glass. These problems can all be represented on a graph in that they are cast to consist of vertices and edges that connect the vertices. In general, each of the vertices and edges can have different values or weights and this causes the graph to have different characteristics in terms of the relationships between various vertices.

One computational problem that can be solved with an analog processor is the Maximum Independent Set problem. Ganey and Johnston defines the related Independent Set problem as:

INSTANCE: Graph G=(V, E), positive integer K≤|V|.
QUESTION: Does G contain an independent set of size K or more, i.e., is there a subset of V, V'⊆V, with |V'|≥K such that no two vertices in V' are joined by an edge in E?

where emphasis is added to show differences between the Maximum Independent Set problem and another problem, known as Clique, that is described below. Expanding upon this definition, consider an undirected edge-weighted graph having a set of vertices and a set of edges, and a positive integer K that is less than or equal to the number of vertices of the graph. The Independent Set problem, expressed as a computational problem, asks whether there is a subset of vertices of size K, such that no two vertices in the subset are connected by an edge of the graph. Many other permutations of the problem exist and include optimization problems based on this computational problem. An example of an optimization problem is the identification of the independent set of the graph that yields the maximum value of K. This is called Maximum Independent Set.

Mathematically, solving Independent Set permits the solving of yet another problem known as Clique. This problem seeks the clique in a graph. A clique is a set of vertices that are all connected to each other. Given a graph, and a positive integer K, the question that is asked in Clique is whether there are K vertices all of which are connected to each other (these vertices are also said to be "neighbors" to each other). Like the Independent Set problem, the Clique problem can be converted to an optimization problem. The computation of cliques has roles in economics and cryptography. Solving an independent set on graph $G_1=(V, E)$ is equivalent to solving clique on $G_1$'s complement $G_2=(V, (V \times V)-E)$, e.g., for all vertices connected by edges in E, remove the edges, insert into $G_2$ edges connecting vertices not connected in $G_1$. Garey and Johnston defines Clique as:

INSTANCE: Graph G=(V, E), positive integer K≤|V|.
QUESTION: Does G contain a clique of size K or more, i.e., is there a subset of V, V'⊆V, with |V'|≥K such that every two vertices in V' are joined by an edge in E?

Here, emphasis has been added to show differences between Clique and Independent Set described above. It can also be shown how Clique is related to the problem Vertex Cover. Again, all problems in NP-complete are reducible to each other within polynomial time, making devices that can efficiently solve one NP-complete problem potentially useful for solving other NP-complete problems as well.

For a graph G=(V, E) consisting of a set of vertices V, and a set of edges E connecting pairs of vertices, the Maximum Independent Set M of G=(V, E) is the largest subset of V, none of which are connected by an edge in E. A Maximum Independent Set M⊆V can be determined by minimizing the following objective:

$$E(x_1, \ldots, x_N) = -\sum_{i \in V} x_i + \lambda \sum_{(i,j) \in E} x_i x_j, \quad (5)$$

In the above, N is the number of vertices in V, i labels vertices, (i,j) labels an edge in E between vertex i and j, and x is either 0 or 1. The indicator variable $x_i$ is equal to 1 if node i is in M, and is equal to 0 otherwise. The first term in equation (5) favors large sets M, and the second term can be seen as a penalty that enforces the constraint that no vertices in M are connected to each other by an edge. The factor λ acts as a Lagrange multiplier and weights the penalty term. For large enough λ, we can ensure that the constraint is satisfied. In some instances, the Lagrange multiplier λ is equal to 2.

The vertices in the graph G can be represented by physical spins $s_i$ with values of −1 and +1. However, to do so, a mapping of $x_i$ to spins $s_i$ is necessary. Vertices present in the graph G are defined to have spin +1 and node vertices in G that are not present in the maximum independent set solution M are defined to have spin −1. The mapping is defined by the following:

$$s_i = 2x_i - 1 \quad (6)$$

Plugging equation (6) into (5) yields the following energy function $$E(s_1, \ldots, s_N) = -\frac{1}{2}|N| + \frac{\lambda}{4}|E| - \frac{1}{2}\sum_{i \in V} s_i\left(1 - \frac{\lambda}{2}d_i\right) + \frac{\lambda}{4}\sum_{(i,j) \in E} s_i s_j, \quad (7)$$

where N is the total number of vertices in G, E is the total number of edges in G, and $d_i$ is the total number of edges connected to vertex i. The solution to the Maximum Independent Set problem can be found by minimizing equation (7).

Another example of an NP class problem is the Ising Spin Glass (ISG) model, which is defined as:

$$E(s_1, \ldots, s_N) = -\sum_{i=1}^{N} h_i s_i + \sum_{i=1}^{N} \sum_{j>i}^{N} J_{ij} s_i s_j, \quad (8)$$

where $s_1$ through $s_N$ are the values of the respective nodes s, $J_{ij}$ represents the value of coupling between the $s_i$ and $s_j$ nodes, and $h_i$ represents the bias on the corresponding node $n_i$. In order to find the solution to the Maximum Independent Set problem, equation (8) is constrained so the couplings ($J_{ij}$) have values of $+\lambda/4$ if an edge exists between nodes i and j and a value of 0 if an edge does not exist between nodes i and j, and the node bias $h_i$ has a value of +a, where a is determined from equation (8) to be $$\frac{1}{2}\left(1 - \frac{\lambda}{2}d_i\right).$$

One example of an NP class problem represented by a graph is the traveling salesperson (TSP) problem. In the TSP problem, various cities are represented by vertices, and roads between the cities are represented by edges. The solution to any particular instance of the TSP is the shortest path that passes through all of the cities exactly once.

The TSP problem provides an excellent illustration of the limitations of state of the art digital computers. In the TSP problem, a traveling salesperson must visit N cities once and only once, returning to the starting point at the end of the journey. The determination that must be made is the optimal route to take. Here, "optimal" depends on the priorities given, but for simplicity, optimal can mean that the total distance traveled is minimized. More realistically, "optimal" might mean that some combination of flight time and cost is minimized. In physical terms, what is sought is the ground state solution or "minimization" of a complicated system. That is, the TSP problem seeks the minimum energy configuration (or in this case, the minimum energy itinerary). The number of possible itineraries depends on the number of cities present. For N cities, including the salesperson's home base, there are (N−1)! possible paths that visit each city only once: N−1 choices for the first city, N−2 for the next, etc. For N=10 cities, this is not too bad: only 362,880. It would not be too exhaustive to have a digital computer calculate the cost of each of these itineraries, and then determine which one had the minimum cost. This technique is known as a "brute-force" or an "exhaustive search." However, the factorial function grows very rapidly with its argument N. In fact, the factorial increases faster than exponentially. For N=20, N!≈$2\times10^{18}$. For a massively parallel digital computer running at rate 100 teraflops, solving a problem of this size would still takes hours. For N=40, N!≈$8\times10^{47}$, it would not be possible to solve the problem using present day digital computers using an exhaustive search approach. An analog processor comprising a plurality of quantum devices and a plurality of coupling devices may be used to minimize the above problems.

5.1 Mapping

In some embodiments of the present methods, articles and systems, a user defines a problem, an NP class problem for example, in terms of a graph description (e.g. a set of vertices and a set of edges), and then an interface computer processes the input to determine the mapping to a lattice. Here, a lattice consists of a set of quantum devices and couplings and may be a grid. As used herein, a lattice is a regular periodic arrangement of quantum devices. Based on the mapping, the analog processor is initialized, performs the computation, and the result is read out and returned to the interface computer. The interface computer may be a digital computer. Examples of digital computers include, but are not limited to, a supercomputer, a cluster of computers connected over a computer network, and a desktop computer.

The ISG problem, defined as the minimization of equation (8) above, is an example of a problem that can be defined on a graph and that falls into the NP class of problems. See, for example, Lidar, 2004, *New Journal of Physics* 6, p. 167, which is hereby incorporated by reference herein in its entirety. It has been shown that other NP class problems can be mapped to the ISG problem in polynomial steps. See, for example, Wocjan et al., 2003, "Treating the Independent Set Problem by 2D Ising Interactions with Adiabatic Quantum Computing," arXiv.org: quant-ph/0302027 (hereinafter "Wocjan"), which is hereby incorporated herein in its entirety. In accordance with the present methods, articles and systems, an analog processor having quantum features is described that is designed to approximate the solution to the ISG problem and, by extension, other mappable classes of NP class problems.

The ISG problem is cast on a two-dimensional lattice containing vertices, also termed nodes. Lines, also termed edges, connect the nodes. For any given instance of the problem the initial state of each node, the weight of each node, and the weight of each edge in the lattice can be specified. Each of the nodes has an information state. The ISG problem involves determining the ground state of the system of nodes for any given configuration of edge weights and node weights on a lattice of size N×M, where N and M represent the number of nodes along a side of the lattice. In some instances, any edge in the problem can have a weight of about 0, meaning that there is no connection between the respective nodes. The edge weights may be set to values ranging from $J_C^F$ to $J_C^{AF}$, where the magnitude $J_C^F$ is the maximum coupling value possible for ferromagnetic coupling between nodes, and the magnitude $J_C^{AF}$ is the maximum coupling value possible for anti-ferromagnetic coupling between nodes. In the alternative, $J_C^F$ may be less than zero and $J_C^{AF}$ is greater than zero. In still another alternative $|J_C^F|$ is greater than $|J_C^{AF}|$. In still another alternative $|J_C^F|$ is equal or approximately equal to $|J_C^{AF}|$. See, for example, U.S. Patent Application Ser. No. 60/640,420 titled "Coupling Schemes for Information Processing" and Ser. No. 11/247,857 titled "Coupling Methods and Architectures for Information Processing", each of which is hereby incorporated by reference in its entirety.

Figure 2A:
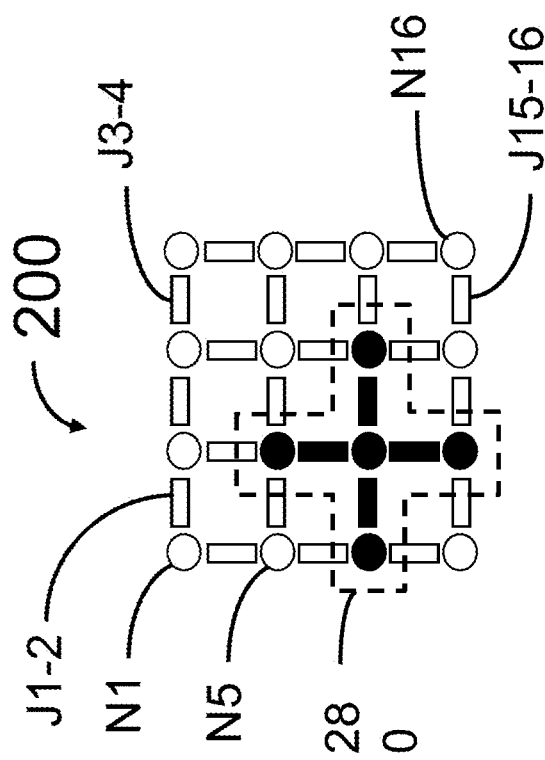
FIG. 2A illustrates a lattice with orthogonal coupling between nodes in accordance with an embodiment of the present methods, articles and systems.

FIG. 2A illustrates an embodiment of the present methods, articles and systems for a four by four rectangular lattice 200, having nodes N1 through N16 as well as couplings J1-2 through J15-16, for a total of 24 couplings. Coupling Ji-j connects node Ni to node Nj. For example, coupling J3-4 connects node N3 to N4. The nodes may represent the vertices of a graph problem and the couplings may represent the edges of the graph problem. For clarity and to emphasize the numbering convention, only a subset of the total nodes and couplings present in lattice 200 are labeled in FIG. 2A. Subset 280 is a subset of lattice 200 that includes a set of five nodes and four couplings. The center node in subset 280 has four nearest-neighbor couplings, which is the largest number of nearest-neighbor couplings of any node in lattice 200.

The nodes on the perimeter of lattice 200 have only two or three nearest neighbors. Lattice 200 has connectivity four since each of the non-perimeter nodes have four nearest-neighbor couplings. In some lattices used in the present methods, articles and systems, the lattice has connectivity three, meaning that each of the non-perimeter quantum devices has three nearest-neighbor couplings.

FIG. 2B illustrates an embodiment of the methods, articles and systems for a four by four rectangular lattice 202 having quantum devices N1 through N16, and coupling devices J1-2 through J15-16 for a total of 42 couplings. Each quantum device in lattice 202 corresponds to a node N in lattice 202. For clarity and to emphasize the numbering convention, only a subset of the total quantum devices and coupling devices present in lattice 202 are labeled in FIG. 2B. Subset 282 is a subset of lattice 202 that includes a set of nine quantum devices and twenty coupling devices. The center quantum device in subset 282 has four nearest-neighbor couplings, such as J14-15, and four next-nearest neighbor couplings, such as J1-6 and J8-11, which is the largest number of nearest-neighbor couplings of any quantum device in lattice 202. The quantum devices on the perimeter of lattice 202 have only two or three nearest neighbors, and one or two next-nearest neighbors, for a total of three or five couplings in total. Lattice 202 has connectivity eight since the non-perimeter quantum devices are coupled to eight neighbors.

FIG. 2C illustrates another embodiment of a lattice in accordance with the present methods, articles and systems. In FIG. 2C, two rectangular lattices with connectivity four are shown, one lattice in black 204 and the other in white 205. They are connected together by diagonal edges like J2-17, which connects node N2 of lattice 205 to node N17 of lattice 204. Therefore, in such a structure, each node in each lattice 204, 205 is diagonally connected to another node in the other lattice. In other words, the structure is similar to having two rectangular lattices, one above the other and each node in each lattice connected to the corresponding node of the other lattice, and then diagonally shifting one lattice. FIG. 2D illustrates another embodiment of a connectivity eight lattice 206 with subset 286. It is structurally the same as FIG. 2B, except that it has been rotated 45°. In some cases, the orientation of the lattice can be rotated by an arbitrary angle without loss of functionality. The lattices 204, 205 of FIG. 2C can be mapped to lattice 206 of FIG. 2D without difficulty.

Lattices with connectivity other than 4 and 8 may be used, such as lattices having a connectivity of 2, 3, 5, 6, or 7. Lattices with connectivity less than 4 can be simulated on a connectivity four lattice by not using certain couplings. For example, by not using any of the vertical couplings in FIG. 2A, lattice 200 becomes a connectivity two lattice. Similarly, lattices with connectivity less than 8 can be simulated on a connectivity eight lattice by not using certain couplings. For example, by not using the striped diagonal couplings in FIG. 2B, sub-lattice 282 becomes a connectivity six lattice. In some circumstances, not using certain couplings may be accomplished by tuning the respective coupling device so that the coupling strength of the coupling device is zero or near zero.

Each quantum device in lattices 200 and 202 has a binary value and a local effective bias that falls somewhere in the range between about $100 \times J_C^F$ and about $+100 \times J_C^{AF}$. Furthermore, each coupling device in lattice 202 has a value ranging from $J_C^F$ to $J_C^{AF}$. The absolute value of $J_C^F$ and $J_C^{AF}$ may be between about 30 millikelvin (mK) and about 10 Kelvin (K), or alternatively, the absolute value of $J_C^F$ and $J_C^{AF}$ may be between about 100 mK and about 1.5 K. While the true units for J are energy, such units can be converted to an equivalent measure of temperature in units, such as Kelvin, by the formula $E=k_B T$, where $k_B$ is Boltzmann's constant. The local effective bias for each quantum device in lattices 200 and 202 may be applied simultaneously, such that more than one of the quantum devices is biased at the same time.

Figure 3B:
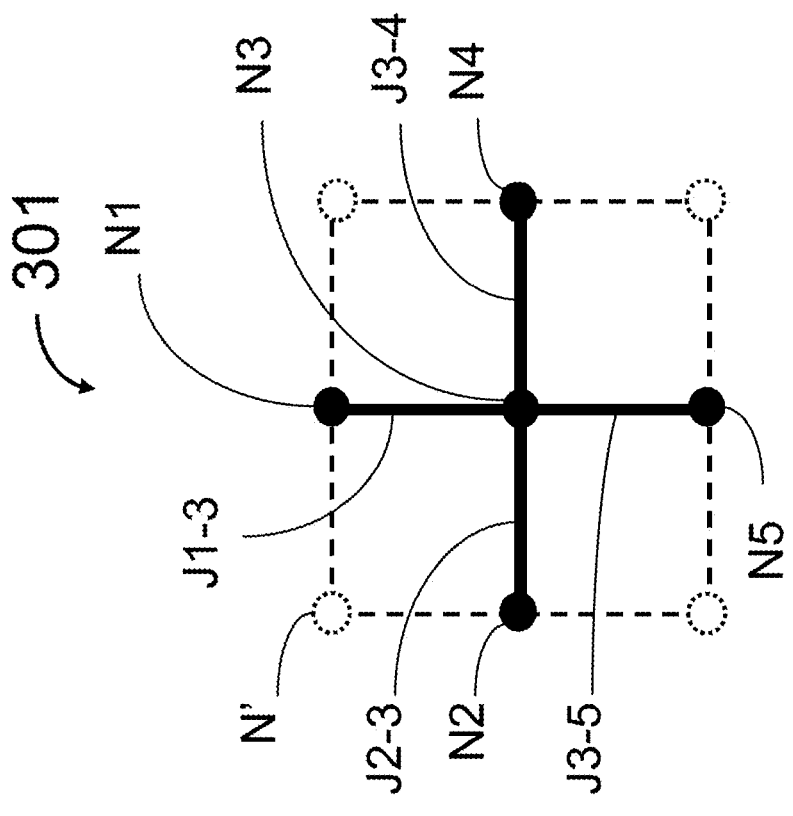
FIGS. 3A and 3B illustrate an embodiment of the methods, articles and systems for mapping a planar graph of five nodes to the corresponding lattice-based analog.
Figure 3A:
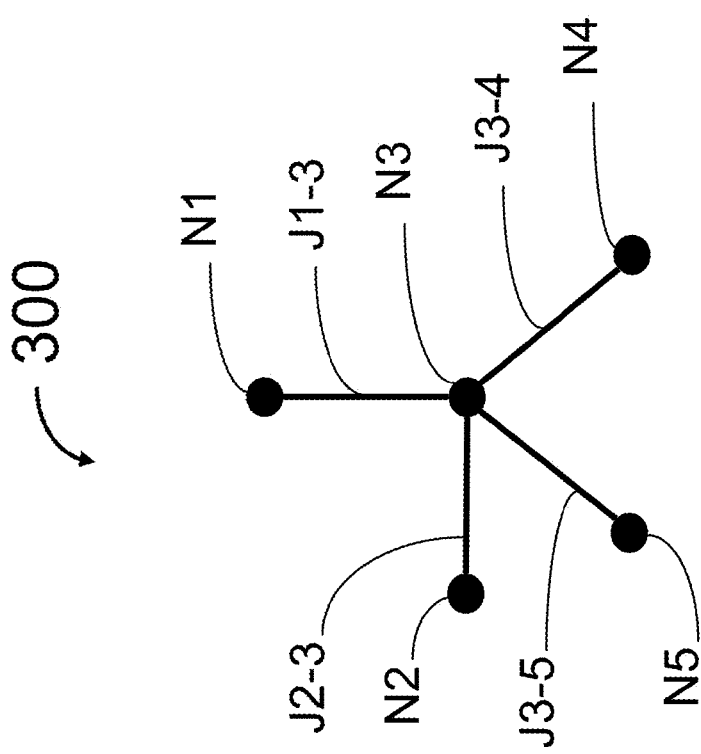

FIGS. 3A and 3B illustrate an embodiment of the present methods, articles and systems for translating between an arbitrary planar graph 300 (FIG. 3A) having five nodes N1-N5 and four couplings (J1-3, J2-3, J3-4, J3-5) to a lattice-based connectivity four layout 301 (FIG. 3B). The nodes of FIG. 3A correspond to the quantum devices of FIG. 3B that have the same label. FIG. 3B illustrates a nine quantum device embodiment in which five of the quantum devices, N1 through N5, are active and four of the quantum devices are inactive. The quantum devices in FIG. 3B defined by dashed lines, one of which is illustrated as N', are inactive quantum devices, which are isolated from the rest of the system. An inactive quantum device is isolated from the active quantum devices by setting the coupling values of the couplings that couple the inactive quantum device to neighboring quantum devices to zero. Note that for clarity and in order to preserve geometry, the labeling for FIG. 3A is maintained in FIG. 3B, starting from the top left of FIG. 3B and moving toward the bottom right of FIG. 3B. In general, mapping from an arbitrary planar graph to a connectivity four lattice is well known and efficient. See, for example, Wocjan.

Figure 4B:
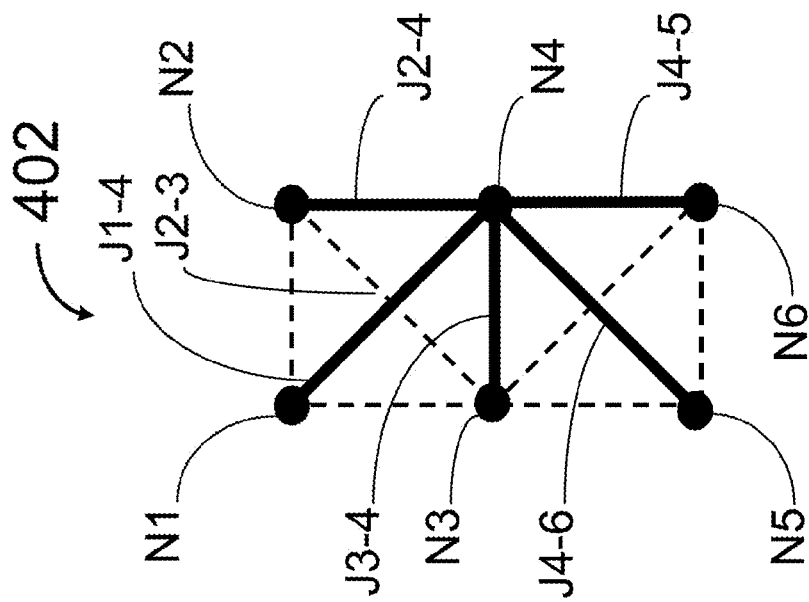
FIGS. 4A and 4B illustrate an embodiment of the methods, articles and systems for mapping a planar graph of six nodes to the corresponding lattice-based analog with next-nearest neighbor coupling.
Figure 4A:
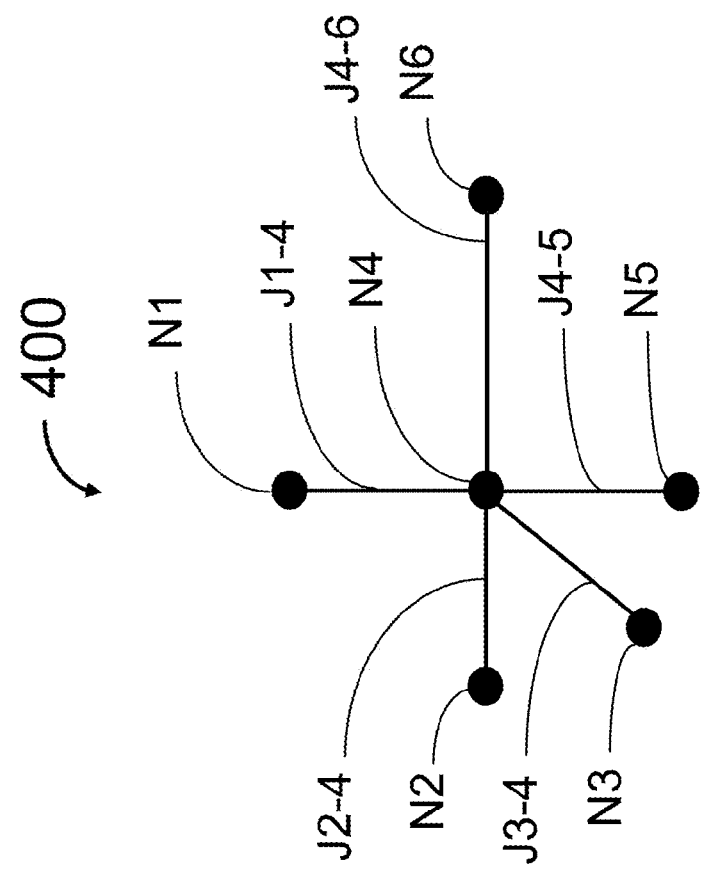

FIGS. 4A and 4B illustrate an aspect of the present methods, articles and systems for translating between a planar graph 400 (FIG. 4A) having six nodes N1-N6 and five couplings (J1-4, J2-4, J3-4, J4-5, J4-6), to a lattice 402 (FIG. 4B) with nearest-neighbor couplings (J2-4, J4-5, J3-4), as well as next-nearest neighbor couplings (J1-4, J4-6). The nodes of FIG. 4A correspond to the quantum devices of FIG. 4B that have the same label. A lattice that makes use of nearest-neighbor couplings as well as next-nearest neighbor couplings is a lattice-based connectivity eight layout. FIG. 4B illustrates a six quantum device embodiment in which all six of the quantum devices, N1 through N6, are active. To embed the same graph shown in FIG. 4A (with connectivity five) into a lattice of connectivity four with only nearest-neighbor couplings would require seven active quantum devices in a lattice of nine quantum devices. It is clear that having next-nearest neighbor couplings as well as nearest-neighbor couplings leads to more efficient and simpler mappings.

Each quantum device in the same graph as a given quantum device may be considered to be a neighboring quantum device of the given quantum device. Alternatively, nearest neighboring quantum devices may be defined as any quantum device in the same graph as the instant quantum device that shares an edge with the instant quantum device. In another alternative, next-nearest neighboring quantum devices may be defined as any quantum device in the same graph as the instant quantum device that is connected to the instant quantum device through two orthogonal edges and another quantum device. In still another alternative, next-nearest neighboring quantum devices may be defined as any quantum devices that is two steps away by Manhattan distance. A Manhattan distance of 1 is the distance between two nodes of a orthogonal two-dimensional graph that are separated by a single edge. For example, N5 and N6 of graph 402 are one step away from each other as measured by Manhattan distance. In another example, N4 and N5 are two steps away from each other, the first step being from N5 to N6 and the second step being from N6 to N4. In graph 402, the nearest-neighbor couplings are drawn as vertical and horizontal lines, e.g., coupling J3-4, while the next-nearest neighbor couplings are drawn at forty-five degree angles, e.g., coupling J1-4. This assignment of nearest-neighbor couplings to vertical and horizontal, and next-nearest neighbor couplings to diagonal, is arbitrary. The next-nearest neighbor couplings may be drawn as vertical and horizontal edges, and nearest-neighbor couplings drawn as diagonal edges. For example, N1 and N4 of graph 402 would be one step away by Manhattan distance in such a case, while nodes N1 and N3 would be two steps away by Manhattan distance. A respective pair of next-nearest neighbor couplings may intersect, e.g., couplings J1-4, and J2-3 of graph 402, while the nearest-neighbor couplings do not intersect. Alternatively, each next-nearest neighbor coupling may cross another next-nearest neighbor coupling. In another alternative, a respective pair of nearest-neighbor couplings may intersect while next-nearest neighbor couplings do not intersect.

A single coupling between two quantum devices may be mapped to one or more couplings between three or more quantum devices. Such a mapping is useful in a lattice-based layout in situations where it is not possible to place the quantum devices adjacent to one another. FIG. 5 illustrates a first graph 500 that includes a simple coupling Ji-j between nodes Ni and Nj. Graph 502 illustrates a series of couplings Ji-1 through Jn-j that couple end-nodes Ni and Nj by coupling intermediate nodes N1 through Nn. Nodes N1 through Nn are referred to as facilitator nodes, and are used to facilitate coupling between end-nodes Ni and Nj when these end-nodes cannot be placed in adjacent positions in a lattice. One of the couplings Ji-1 through Jn-j may be deemed to be the sign coupling. The sign coupling takes on the same sign as the coupling Ji-j in arbitrary planar graph 500, while the remaining couplings are fixed in a ferromagnetic coupling state. For example, consider the case in which the sign of coupling Ji-j in graph 500 is positive or anti-ferromagnetic, and coupling Ji-1 in graph 502 has been deemed to be the sign coupling. Then, if graph 502 is to represent the coupling Ji-j of graph 500, coupling Ji-1 is set to positive or anti-ferromagnetic, while the remaining couplings between nodes Ni and Nj in graph 502 are set to negative or ferromagnetic. Likewise, consider the case in which the sign of coupling Ji-j in graph 500 is negative or ferromagnetic and coupling Ji-1 in graph 502 is still deemed to be the sign coupling. In this case, the sign of Ji-1 in graph 502 is set to negative or ferromagnetic while the remaining couplings are also set to negative or ferromagnetic. Thus, Ji-1 is the signed coupling, and J1-2 through Jn-j are set to negative or ferromagnetic. To facilitate interaction, nodes N1 through Nn are set to have zero effective local field bias, such that they become passive nodes and transfer information between nodes Ni and Nj without interfering. In both described examples, one of the couplings in graph 502 is made identical to the coupling Ji-j in 500 and all the remaining couplings in graph 502 are set to be negative or ferromagnetic.

Where one of the couplings in graph 502 is made identical to the coupling Ji-j in 500 and all the remaining couplings in graph 502 are set to be negative or ferromagnetic, couplings can be achieved by using rf-SQUIDs or dc-SQUIDS (both described below) as coupling devices. Alternatively, the couplings in graph 502 may all be direct galvanic connections such that node Ni is electrically connected to node Nj, in which case all individual couplings are ferromagnetic, and therefore the overall coupling Ji-j is ferromagnetic and nodes Ni and Nj have the same quantum state. In another alternative, the couplings in graph 502 may comprise a mixture of galvanic couplings, rf-SQUID couplings, and dc-SQUID couplings, in which case one rf-SQUID or dc-SQUID coupling is made identical to the coupling Ji-j in 500 and all the remaining couplings in graph 502 are negative or ferromagnetic.

Figure 6B:
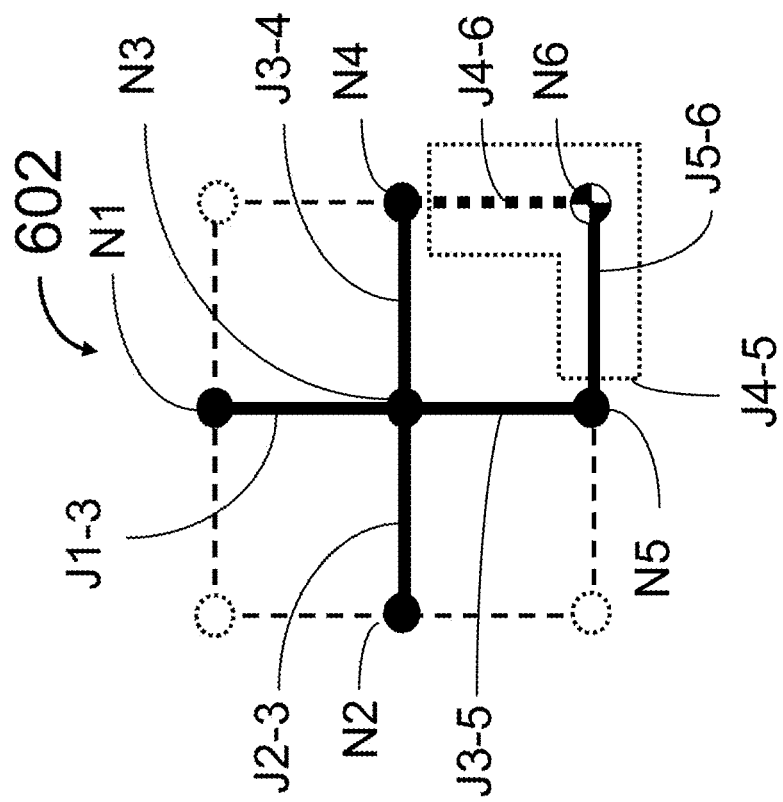
FIGS. 6A and 6B illustrate an embodiment of the methods, articles and systems for mapping a planar graph to the corresponding lattice-based analog.
Figure 6A:
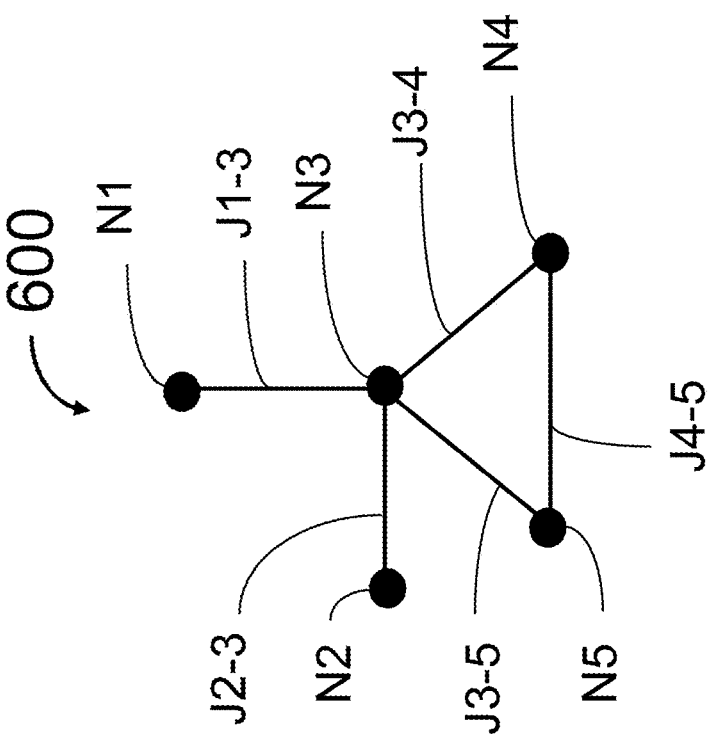

FIGS. 6A and 6B illustrate another aspect for translating between an example of a planar graph 600 (FIG. 6A), comprising five nodes N1-N5 and five couplings (J1-3, J2-3, J3-4, J4-5), to a lattice-based connectivity four layout 602 (FIG. 6B). The nodes of FIG. 6A correspond to the quantum devices of FIG. 6B that have the same label. FIG. 6A illustrates coupling J4-5 between nodes N4 and N5. FIG. 6B illustrates an embodiment of a mapping to a lattice-based connectivity four layout and further illustrates the use of a sixth quantum device, N6, as a facilitator node (quantum device) to realize coupling J4-5 between quantum devices N4 and N5. In FIG. 6B, N4 is connected to N5 through the effective coupling J4-5. Effective coupling J4-5 comprises quantum device N6 and couplings J4-6 and J5-6.

When coupling J4-5 is anti-ferromagnetic in graph 600, coupling J4-6 in lattice 602 can be assigned a magnitude with a positive sign, where the positive sign indicates anti-ferromagnetic coupling. Then, coupling J5-6 will be assigned the appropriate magnitude with a negative value that indicates ferromagnetic coupling. This will make the spin at N6 track the spin at N5. In other words, the spin at N5 is copied to N6. Alternatively, coupling J5-6 of lattice 602 could be chosen as the sign coupling, thus taking on the same sign as coupling J4-5 of graph 600 (in this example positive indicating anti-ferromagnetic coupling), and J4-6 would then be fixed as a ferromagnetic coupling. This will make the spin at N6 track the spin at N4. In other words, the spin at N4 is copied to N6. In both examples, quantum device N6 is a facilitator quantum device and will have a zero effective local bias field applied, so that the spin state at N6 can track the spin state of the quantum device to which it is ferromagnetically coupled.

The present methods, articles and systems provide for embedding non-planar graphs in a two dimensional grid-based layout by making use of nearest-neighbor and next-nearest neighbor couplings vertices in the grid-based layout. As is known in the art, a complete graph with n vertices, denoted $K_n$, is a graph with n vertices in which each vertex is connected to each of the others, with one edge between each pair of vertices. The first five complete graphs, $K_1$ through $K_5$, are illustrated in FIG. 7. As defined herein, a non-planar graph is a graph that includes the complete graph $K_5$ or the bipartite graph $K_{3,3}$ as a subgraph. A graph is bipartite if its vertices can be partitioned into two disjoint subsets U and V such that each edge connects a vertex from U to one from V. A bipartite graph is a complete bipartite graph if every vertex in U is connected to every vertex in V. If U has n elements and V has m, then the resulting complete bipartite graph is denoted by $K_{n,m}$. FIG. 8 illustrates a $K_{3,3}$ bipartite graph. Any non-planar graph is an expansion of one of $K_5$ or $K_{3,3}$. Graphs are expanded by adding edges and nodes. The planar array can be rectangular. Example applications include solving an instance of a problem defined on a non-planar graph embedded in a planar array with nearest-neighbor and next-nearest neighbor couplings.

Figure 9B:
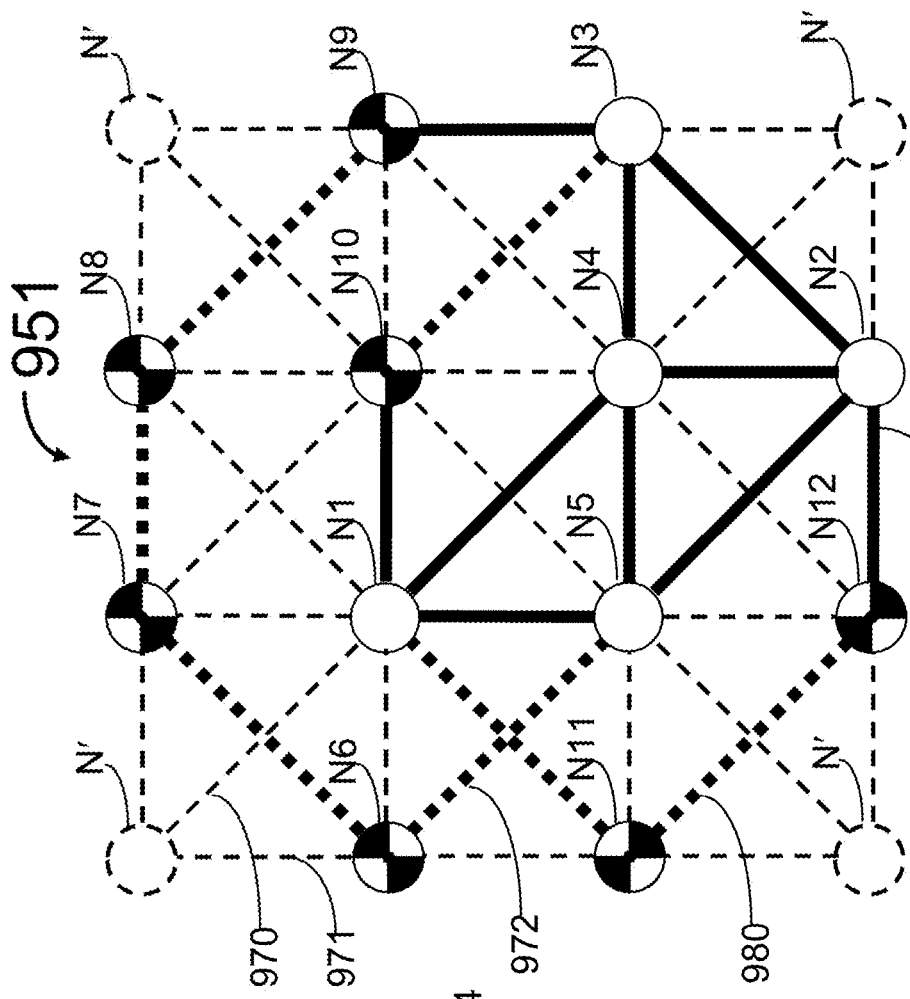
FIGS. 9A and 9B illustrate an embodiment of the methods, articles and systems for mapping a non-planar graph to the corresponding lattice-based analog with next-nearest neighbor coupling.
Figure 9A:
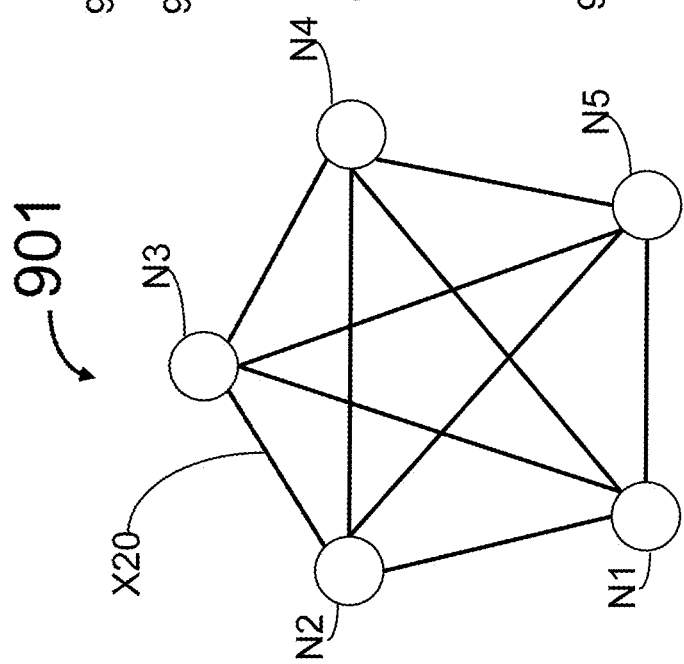

FIGS. 9A and 9B illustrate translation between a non-planar graph 901 (FIG. 9A) having five nodes N1-N5 and ten couplings to a lattice-based layout 951 (FIG. 9B) with nearest-neighbor couplings as well as next-nearest neighbor couplings (only the couplings referred to specifically below are labeled in FIGS. 9A and 9B) according to the present systems, articles and methods. Next-nearest neighbor couplings in FIG. 9B are those couplings that are at 45 degree angles in FIG. 9B, e.g., coupling 970. Lattice 951 comprises sixteen quantum devices, twelve of which (N1-N12) are active, i.e., coupled to at least one other quantum device. The particular graph shown in FIG. 9A, is called $K_5$ graph. It is the completely connected graph on five nodes, meaning that each node is connected to every other node in the graph. $K_5$ is the smallest non-planar graph. Any graph that contains $K_5$ as a sub-graph will also be non-planar. The $K_5$ graph 901 illustrated in FIG. 9A can be embedded into a lattice, such as rectangular lattice 951 illustrated in FIG. 9B. Similarly, any non-planar graph with $K_5$ as a subgraph can be embedded in a lattice like lattice 951. The inactive nodes in FIG. 9B, N', are shown with dashed lines, and are isolated from the rest of the system. In practice, an inactive quantum device is isolated from the active quantum devices by setting the coupling values of the adjacent couplings, e.g., coupling 971, to zero or, more generally, a negligible value.

Facilitator quantum devices are used to effect a transformation from a planar graph to a two-dimensional lattice layout. The transformation from non-planar graph 901 to two-dimensional lattice 951 is an isomorphism of quantum devices, anti-ferromagnetic couplings, plus the use of facilitator quantum devices, and ferromagnetic couplings. Nodes N1-N5 in graph 901 correspond to quantum devices N1-N5 in lattice 951. The sign coupling between nodes correspond in part to edges in graph 901. The edges in graph 901 are represented by a combination of signed couplings and ferromagnetic couplings in lattice 951. Sign couplings are denoted by solid thick lines between a pair of quantum devices in lattice 951, e.g., coupling 973. Ferromagnetic couplings are denoted by dashed thick lines in lattice 951, e.g., coupling 972. Each ferromagnetic coupling in lattice 951 passes through a facilitator quantum device. Facilitator quantum devices in lattice 951 include quantum devices N6 through N12, and are distinguishable in lattice 951 because they are depicted as checkered. The local field bias of each facilitator quantum device may be set to zero. Facilitator quantum devices cooperate with the ferromagnetic couplings to propagate a sign coupling. For example, facilitator quantum device N12, together with ferromagnetic coupling 980, propagates sign coupling 973.

Each sign coupling in a two-dimensional lattice layout (e.g., layout 951) may be either a ferromagnetic or anti-ferromagnetic coupling. Alternatively, each sign coupling in a two-dimensional lattice layout may be an anti-ferromagnetic coupling.

FIG. 10A 10B illustrate an example in accordance with the present methods, articles and systems in which a non-planar $K_{3,3}$ graph 1001 (FIG. 10A) having six nodes N1-N6 is embedded in a lattice-based layout 1051 (FIG. 10B) having nearest-neighbor couplings as well as next-nearest neighbor couplings. Lattice 1051 is a $K_{3,3}$ graph embedded in a three by four array. Nodes N1 through N6 in graph 1001 correspond to quantum devices N1 through N6 of lattice 1051. Couplings (N1, N2), (N1, N4), (N3, N2), (N3, N4), (N3, N6), (N5, N4), and (N5, N6) in lattice 1051 are anti-ferromagnetic couplings that correspond to the edges of graph 1001, and are marked by thick black lines. For example, anti-ferromagnetic coupling 1070 in lattice 1051 couples N1 and N2 in lattice 1051 and corresponds to edge 1020 of graph 1001.

Couplings (N1, N6) and (N5, N2) are each propagated by one anti-ferromagnetic coupling denoted by thick black lines ((N1, N8) and (N5, N7), respectively), and a set of ferromagnetic couplings denoted by thick dashed lines ((N7, N2), and (N8, N10), (N10, N9), (N9, N11) and (N11, N6), respectively), though facilitator nodes denoted by a checked pattern (N7, and N8, N10, N9 and N11, respectively). Facilitator quantum devices, e.g., N7, N8, N9, N10 and N11, are quantum devices with zero local field bias that cooperate with the ferromagnetic couplings to propagate an anti-ferromagnetic coupling. For lattice 1051, eleven quantum devices are used to embed graph 1001, but as few as nine quantum devices could be used to embed graph 1001 if quantum devices N9 and N11 are bypassed with diagonal couplings (N8, N9) and (N9, N6). Inactive quantum device N' is denoted by dashed outline.

As with the $K_5$ graph illustrated in FIG. 7, any non-planar graph with $K_{3,3}$ as a subgraph, can be embedded in a lattice like 1051.

Figure 11:
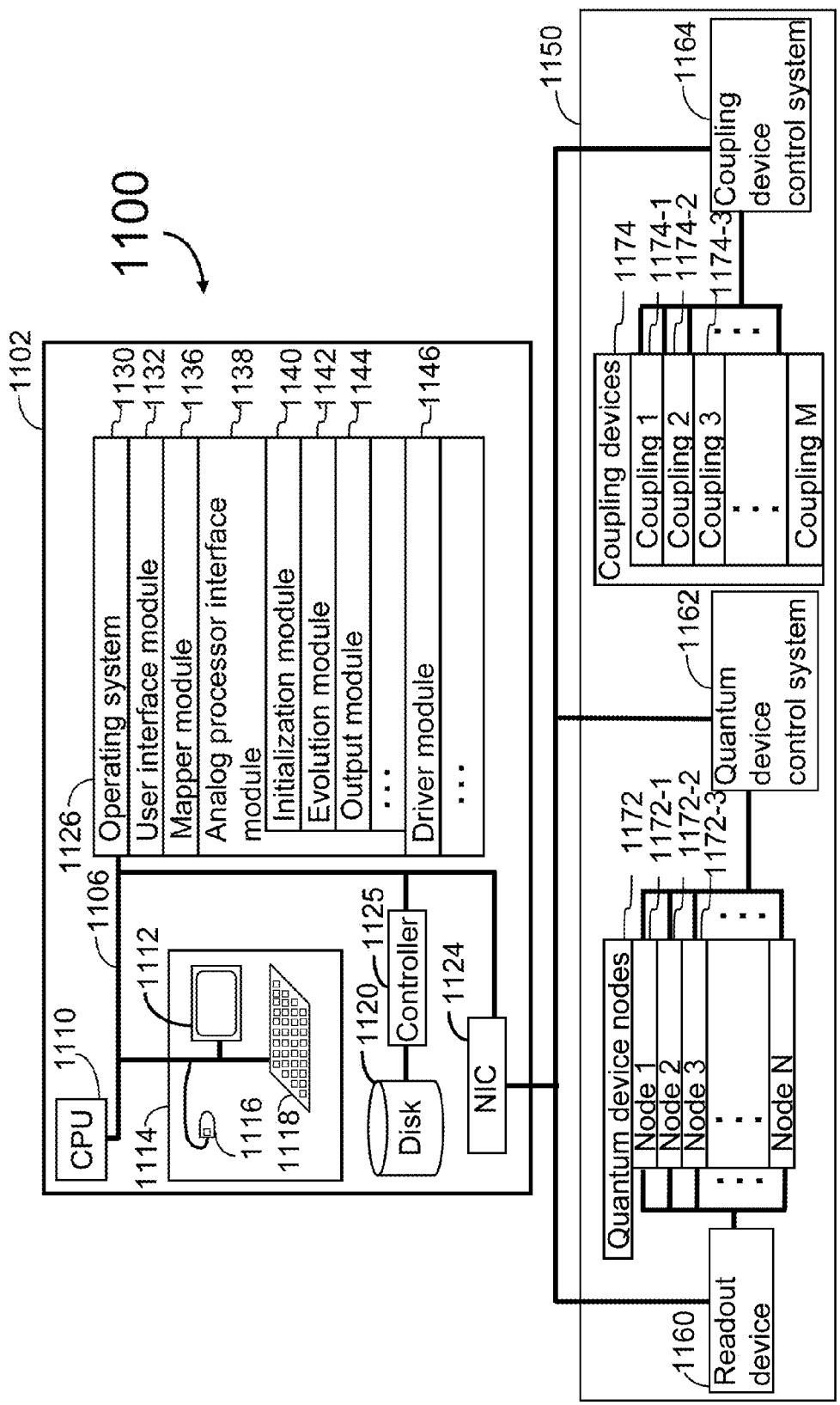
FIG. 11 illustrates a system that is operated in accordance with one embodiment of the present methods, articles and systems.

FIG. 11 illustrates a system 1100 that is operated in accordance with one embodiment of the present methods, articles and systems. System 1100 includes a digital computer 1102 that comprises at least one CPU 1110;
a main non-volatile storage unit 1120 controlled by controller 1125;
a system memory 1126, preferably high speed random-access memory (RAM), for storing system control programs such as operating system 1130, data and application programs loaded from non-volatile storage unit 1120; system memory 1126 may also include read-only memory (ROM);
a user interface 1114, comprising one or more input devices (e.g., keyboard 1118, mouse 1116) and display 1112, and other optional peripheral devices;
a network interface card (NIC) 1124 or other communication circuitry; and
an internal bus 1106 for interconnecting the aforementioned elements of system 1100.

System 1100 further includes an analog processor 1150. Analog processor 1150 includes a plurality of quantum device nodes 1172 and a plurality of coupling devices 1174. Although not illustrated in FIG. 11, quantum device nodes 1172 and coupling devices 1174 may be arranged in a lattice-based connectivity four layout such as, for example, illustrated in FIGS. 2A, 3B, 6B, 12A, 12B, 13A and 13B. Alternatively, quantum device nodes 1172 and coupling devices 1174 may be arranged in a lattice-based connectivity eight layout such as, for example, illustrated in FIGS. 2B, 4B, 9B, 10B and 14B. As such, nodes 1172 and coupling devices 1174 are equivalent in all respects to any of the nodes or coupling devices illustrated or described in relation to those figures.

Analog processor 1150 further includes a readout device 1160. Readout device 1160 may comprise a plurality of dc-SQUID magnetometers, where each dc-SQUID magnetometer is inductively connected to a different quantum device node 1172 and NIC 1124 receives a voltage or current from readout device 1160, as measured by each dc-SQUID magnetometer in readout device 1160.

Analog processor 1150 further comprises a coupling device control system 1164 that includes a coupling controller for each coupling device 1174. Each respective coupling controller in coupling device control system 1164 is capable of tuning the coupling strength of a corresponding coupling device 1174 through a range of values $J_C^F$ to $J_C^{AF}$, where the magnitude $J_C^F$ is the maximum coupling value possible for ferromagnetic coupling between nodes, and the magnitude $J_C^{AF}$ is the maximum coupling value possible for anti-ferromagnetic coupling between nodes. Analog processor 1150 further comprises a quantum device control system 1162 that includes a controller for each quantum device node 1172.

A number of modules and data structures may be stored and processed by system 1100. Typically, all or a portion of such data structures are stored in memory 1126 and for ease of presenting the various features and advantages of the present methods, articles and systems, such data structures and program modules are drawn as components of memory 1126. However, it will be appreciated that at any given time, the programs and data structures illustrated in system memory 1126 can be stored in non-volatile storage unit 1120. Furthermore, all or a portion of such data structures and program modules may be stored on a remote computer not illustrated in FIG. 11, provided that the remote computer is addressable by digital computer 1102. By addressable, it is meant that there is some communication means between the remote computer and digital computer 1102 such that data can be exchanged between the two computers over a data network (e.g., the Internet, a serial connection, a parallel connection, Ethernet, etc.) using a communication protocol (e.g., FTP, telnet, SSH, IP, etc.). With this in mind, such data structures and program modules will now be described.

Computer 1102 may be an operating system 1130 for handling various system services, such as file services, and for performing hardware dependent tasks. Many operating systems that can serve as operating system 1130 are known in the art including, but not limited to UNIX, Windows NT, Windows XP, DOS, LINUX, and VMX. Alternatively, no operating system may be present and instructions may be executed in a daisy chain manner.

User interface module 1132 serves to help a user define and execute a problem to be solved on analog processor 1150. Specifically, user interface module 1132 permits a user to define a problem to be solved by setting the values of couplings between nodes and the local bias $h_i$ of such nodes, and adjusting run-time control parameters, such as annealing schedule. User interface module 1132 also provides instructions for scheduling a computation as well as acquiring the solution to the problem. Specifically, the solution of the computation is collected as an output from analog processor 1150. User interface module 1132 may or may not include a graphical user interface (GUI). Where a GUI is not included, user interface module 1132 receives a series of instructions that define a problem to be solved. This series of instructions can be in the form of a macro language that is parsed by user interface module 1132. The instructions may be XML instructions and user interface module 1132 may be an XML interpreter.

Mapper module 1136 maps the computational problem to be solved as defined by user interface module 1132 into a corresponding problem description that is solvable by analog processor 1150. Mapper module 1136 may map problems from one input graph representation into the desired graph representation required for a specific configuration of analog processor 1150. Mapper module 1136 may include instructions that map a problem defined in a non-connectivity eight graph representation into an equivalent problem defined on a connectivity eight graph representation. Mapper module 1136 may map certain NP problems (e.g., Maximum Independent Set, Max Clique, Max Cut, TSP problem, k-SAT, integer linear programming, etc.) into an equivalent representation in the ISG model.

Once a desired graph representation needed to solve a desired problem has been mapped by mapper module 1136, analog processor interface module 1138 is used to set up the coupling values and local bias values for the respective coupling devices 1174 and quantum device nodes 1172 of analog processor 1150. The functions of analog processor interface module 1138 may be divided into three discrete program modules: an initialization module 1140, an evolution module 1142, and an output module 1144.

Initialization module 1140 determines the appropriate values of coupling $J_{ij}$ for coupling devices 1174 and values of local bias $h_i$ for quantum device nodes 1172 of analog processor 1150. Initialization module 1140 may include instructions to convert aspects in the definition of the problem into physical values, such as coupling strength values and node bias values, which can be programmed into analog processor 1150. Initialization module 1140 then sends the appropriate signals along internal bus 1106 into NIC 1124. NIC 1124, in turn, sends such commands to quantum device control system 1162 and coupling device control system 1164.

For any given problem, evolution module 1142 determines the appropriate values, at each point in time for the duration of the evolution, of coupling $J_{ij}$ for coupling devices 1174 and values of local bias $h_i$ for quantum device nodes 1172 of analog processor 1150 in order to fulfill some predetermined evolution schedule. Once evolution module 1142 has determined the appropriate coupling device values and local bias values for an evolution schedule, such signals are sent along bus 1106 and into NIC 1124. NIC 1124, in turn, sends such commands to quantum device control system 1162 and coupling device control system 1164.

The evolution of analog processor 1150 may be an adiabatic evolution or an annealing evolution. Adiabatic evolution is the evolution used in adiabatic quantum computing, and evolution module 1142 may include instructions for evolving the state of analog processor 1150 in accordance with evolution used in adiabatic quantum computing. See, for example, U.S. Patent Publication Nos. 2005-0256007; 2005-0250651; and 2005-0224784 each titled "Adiabatic Quantum Computation with Superconducting Qubits," each of which is hereby incorporated by reference in its entirety. Annealing is another form of evolution applicable to certain analog processors 1150, and evolution module 1142 may include instructions for evolving the state of analog processor 1150 in accordance with annealing evolution Analog processor 1150 solves a quantum problem based upon the signals provided by initialization module 1140 and evolution module 1142. Once the problem has been solved, the solution to the problem may be measured from the state quantum device nodes 1172 by readout device 1160. Output module 1144 works in conjunction with readout device 1160 of quantum processor 1150 to read this solution.

System memory 1126 may further include a driver module 1146 for outputting signals to analog processor 1150.

NIC 1124 may include appropriate hardware required for interfacing with quantum device nodes 1172 and coupling devices 1174 of analog processor 1150, either directly or through readout device 1160, quantum device control system 1162, and/or coupling device control system 1164. Alternatively, NIC 1124 may include software and/or hardware that translates commands from driver module 1146 into signals (e.g., voltages, currents) that are directly applied to quantum device nodes 1172 and coupling devices 1174. In another alternative, NIC 1124 may include software and/or hardware that translates signals (representing a solution to a problem or some other form of feedback) from quantum device nodes 1172 and coupling devices 1174 such that they can be interpreted by output module 1144. In some cases, therefore, initialization module 1140, evolution module 1142, and/or output module 1144 communicate with driver module 1146 rather than directly with NIC 1124 in order to send and receive signals from analog processor 1150.

The functionality of NIC 1124 can be divided into two classes of functionality: data acquisition and control. Different types of chips may be used to handle each of these discrete functional classes. Data acquisition is used to measure physical properties of quantum device nodes 1172 after analog processor 1150 has completed a computation. Such data can be measured using any number of customized or commercially available data acquisition microcontrollers including, but not limited to, data acquisition cards manufactured by Elan Digital Systems (Fareham, UK) including the AD132, AD136, MF232, MF236, AD142, AD218, and CF241 cards. Alternatively, data acquisition and control may be handled by a single type of microprocessor, such as the Elan D403C or D480C. There may be multiple NICs 1124 in order to provide sufficient control over quantum device nodes 1172 and coupling devices 1174 and in order to measure the results of a quantum computation on analog processor 1150.

Digital computer 1102 may also comprise means for transmitting the solution of a computational problem processed by analog processor 1150 to another system. Devices for accomplishing these means can include, but are not limited to, a telephone modem, a wireless modem, a local area network connection, or a wide area network connection. Digital computer 1102 may generate a carrier wave embodying a data signal, wherein the data signal encodes the solution of the computational problem processed by analog processor 1150.

Analog processor 1150 may be a superconducting quantum computer, examples of which include qubit registers, read out devices, and ancillary devices. Superconducting quantum computers normally are operated at millikelvin temperatures, and often are operated in a dilution refrigerator. An example of a dilution refrigerator is a model from the Leiden Cryogenics B.V. MNK 126 series (Galgewater No. 21, 2311 VZ Leiden, The Netherlands). All or part of the components of analog processor 1150 can be housed in the dilution refrigerator. For example, quantum device control system 1162 and the coupling device control system 1164 could be housed outside the dilution refrigerator with the remaining components of analog processor 1150 being housed inside the dilution refrigerator.

User interface module 1132, analog processor interface module 1138, and driver module 1146, or any combination thereof, may be implemented in existing software packages. Suitable software packages include, but are not limited to MATLAB (The MathWorks, Natick, Mass.) and LabVIEW (National Instruments, Austin, Tex.).

The present methods, articles and systems may be implemented as a computer program product that comprises a computer program mechanism embedded in a computer readable storage medium. For instance, the computer program product could contain the program modules shown in FIG. 11. These program modules can be stored on a CD-ROM, DVD, magnetic disk storage product, or any other computer readable data or program storage product. The software modules in the computer program product can also be distributed electronically, via the Internet or otherwise, by transmission of a computer data signal (in which the software modules are embedded) embodied in a carrier wave.

5.2 Processor and Quantum Devices

In accordance with an embodiment of the present methods, articles and systems, a machine analog of the ISG problem capable of approximating a ground state solution may be provided in the form of an analog processor (e.g., analog processor 1150 of FIG. 11). This analog processor comprises a hardware architecture that includes a set of quantum devices (e.g., quantum device nodes 1172 of FIG. 11). Each such quantum device is defined by at least two basis states and is capable of storing binary information in the basis states. The analog processor further comprises a readout device for the quantum devices (e.g., readout device 1160 of FIG. 11), capable of detecting the binary information stored in the corresponding quantum devices. The analog processor further comprises a set of coupling devices (e.g., coupling devices 1174 of FIG. 11) that connect each node to its nearest-neighbor node(s) and/or its next-nearest neighbor node(s), as described above for example in conjunction with FIGS. 2A, 2B, 3A, 3B, 4A, 4B, 6A, 6B, 9A, 9B, 10A and 10B. The analog processor further comprises a coupling controller (e.g., housed in coupling device control system 1164 of FIG. 11) for each coupling device. Each respective coupling controller is capable of tuning the coupling strength J of a corresponding coupling device through a range of values $J_C^F$ to $J_C^{AF}$, where $J_C^F$ is the maximum ferromagnetic coupling strength and is negative and $J_C^{AF}$ is the maximum anti-ferromagnetic coupling strength and is positive. A J value of zero for a given coupling between two nodes means that the two nodes are not coupled to each other.

The analog processor further comprises a node controller for each quantum device (e.g., housed in quantum device control system 1162 of FIG. 11). Each such node controller is capable of controlling an effective bias applied to a corresponding quantum device. Such effective bias varies from about −100×|J| to about +100×|J|, where J is the average maximum coupling value for the respective node.

The quantum devices in the quantum processor may have distinct information basis states to facilitate readout and initialization. The quantum devices may make use of quantum properties such as incoherent quantum tunneling between basis states, coherent quantum tunneling between basis states, or entanglement between states of different quantum devices, and the quantum properties of the quantum devices may enhance the computational capability of the analog processor.

The analog processor performs a computation to approximate the ground state of the mapped system. The information states traverse an energy landscape that depends on the conditions dictated by the instance of the problem. In this energy landscape, the ground state energy is the lowest energy point, referred to as the global minimum. The energy landscape contains local minima, which can trap the state of the system (comprising all the quantum devices and couplings within the lattice) and prevent it from moving to lower energy minima. Introducing quantum properties permits the state of the analog processor to tunnel out of these local minima, such that the state can move to the lower energy minima more easily, or with greater probability than if there were no quantum tunneling. Such an analog processor is capable of processing information with substantially reduced constraints compared to a digital processor.

5.2.1 Superconducting Devices

In certain embodiments of the present methods, articles and systems, the quantum devices of the analog processor (e.g., quantum device nodes 1172 of FIG. 11) are superconducting qubits. In such embodiments, the analog processor may comprise any number of superconducting qubits, such as four or more, ten or more, twenty or more, 100 or more, or between 1,000 and 1,000,000, superconducting qubits.

Superconducting qubits have two modes of operation related to localization of the states in which information is stored. When the qubit is initialized or measured, the information is classical, 0 or 1, and the states representing that classical information are also classical to facilitate reliable state preparation. Thus, a first mode of operation of a qubit is to permit state preparation and measurement of classical information. The first mode of operation is useful for embodiments of the present methods, articles and systems.

A second mode of operation of a qubit occurs during quantum computation. During such quantum computation, the information states of the device are dominated by quantum effects such that the qubit evolves controllably as a coherent superposition of those states and, in some instances, becomes entangled with other qubits in the quantum computer. The second mode of operation, however, is difficult to realize with high enough quality to perform universal quantum computation.

Superconducting qubits may be used as nodes. Operation in the first mode makes them ideal for readout and the constraints present in the second mode of operation, such as difficulty in reading out the qubits, coherence time requirement, etc., are considerably reduced. A superconducting qubit may serve as a node in the analog processor and stay in the first mode of operation, such that when readout is not being performed the qubit remains in the first mode of operation and computation is still performed. As such, minimal quantum properties are evident and influences on the state of the qubit are minimal.

Superconducting qubits generally have properties that fall into two categories: phase qubits and charge qubits. Phase qubits are those that store and manipulate information in the phase states of the device. In other words, phase qubits use phase as the information-bearing degree of freedom. Charge qubits store and manipulate information in the charge states of the device. In other words, charge qubits use charge as the information-bearing degree of freedom. In superconducting materials, phase differences exist between different points of the superconducting material and elementary charges are represented by pairs of electrons called Cooper pairs that flow in the superconducting material. The division of such devices into two classes is outlined in Makhlin. Phase and charge are related values in superconductors and, at energy scales where quantum effects dominate, phase qubits have well-defined phase states for storing quantum information, and charge qubits have well-defined charge states for storing quantum information. In the present methods, articles and systems, superconducting qubits that are phase qubits, charge qubits, or a hybrid between phase and charge qubits, can be used in the analog processor.

Experimental realization of superconducting devices as qubits was made by Nakamura et al., 1999, *Nature* 398, p. 786, hereby incorporated herein by reference in its entirety, who developed a charge qubit that demonstrates the basic operational requirements for a qubit but with poor (short) decoherence times and stringent control parameters.

5.3 Mapping to Superconducting Integrated Circuits

In accordance with embodiments of the present methods, articles and systems, the ISG lattice-based layout maps directly to an integrated circuit that satisfies all of the requirements for performing the calculation to approximate or determine exactly the ground state of the system. The analog processor may comprise:

(i) a set of nodes, each node including a loop of superconducting material interrupted by one or more Josephson junctions;

(ii) a set of coupling devices, each coupling device in the set of coupling devices coupling two nodes in the set of nodes;

(iii) a set of readout devices, each readout device in the set of readout devices configured to readout the state of one or more corresponding nodes in the set of nodes; and (iv) a set of local bias devices, where each local bias device in the set of local bias devices is configured to apply a local bias field on one or more corresponding nodes in the set of nodes.

One or more coupling devices in the set of coupling devices may each comprise a loop of superconducting material interrupted by one or more Josephson junctions. The parameters of such coupling devices are set based on the loop size and Josephson junction characteristics. Such coupling devices are typically tuned by a corresponding control system that applies either a magnetic or electric bias.

Figure 12B:
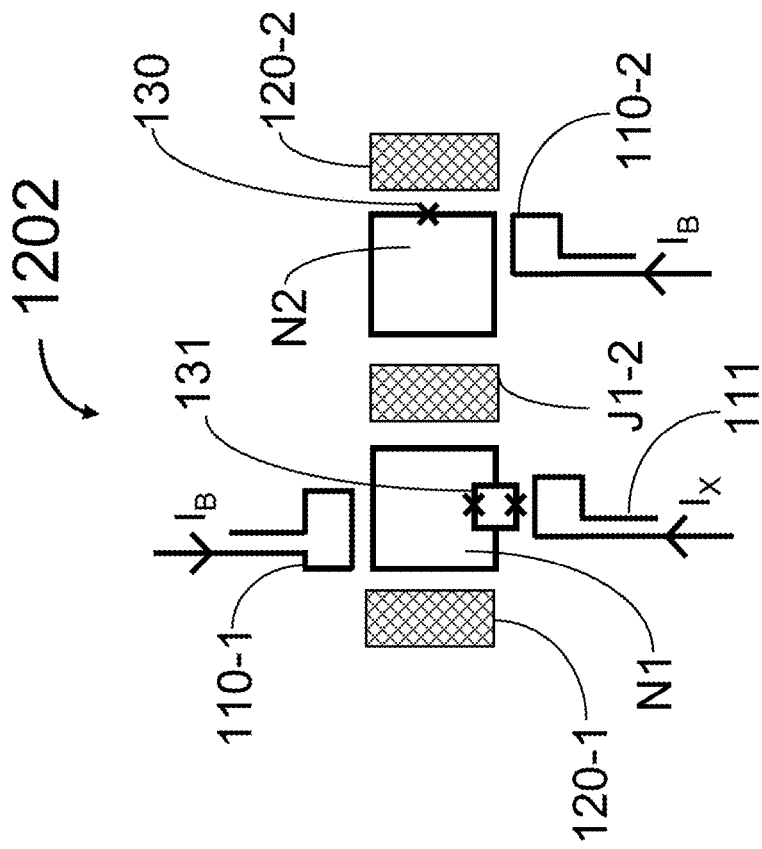
FIGS. 12A and 12B illustrate an embodiment of the methods, articles and systems for mapping a lattice-based graph to an integrated circuit.
Figure 12A:
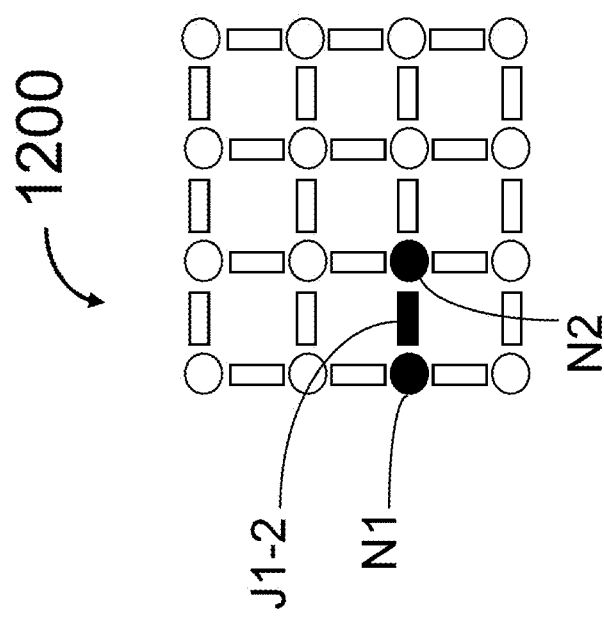

FIG. 12A illustrates a graph 1200, with two nodes N1 and N2 and a single coupling device J1-2 that couples nodes N1 and N2 labeled. FIG. 12B illustrates a translation of nodes N1 and N2 and coupling device J1-2 of graph 1200 to an integrated circuit 1202. Integrated circuit 1202 includes superconducting nodes N1 and N2, which correspond to nodes N1 and N2 of graph 1200. Integrated circuit 1202 further includes bias devices 110-1 and 110-2 as well as readout devices 120-1 and 120-2 respectively, and a single coupling device J1-2. In FIG. 12B, nodes N1 and N2, each rf-SQUIDs, can include a single Josephson junction 130, or a compound Josephson junction 131. The compound Josephson junction 131 can also be described as a dc-SQUID interrupting a superconducting loop. Magnetic flux can then be applied to the compound Josephson junction 131 to provide an extra degree of modulation of the node parameters. Specifically, the tunneling rate of the quantum device (superconducting node N1) can be adjusted by varying the current supplied by device 111. Equivalently, the height of an energy barrier 1700 of the system (shown in FIG. 17 and described below) can be adjusted.

Nodes N1 and N2 may be three Josephson junction qubits. Such structures comprise a superconducting loop interrupted by three Josephson junctions. Nodes N1 and N2 in integrated circuit 1202 each have two states that correspond to the two possible directions of current or supercurrent flow in their respective superconducting loops. For instance, a first state of node N1 and of N2 is represented by clockwise circulating current and a second state is represented by counter-clockwise circulating current in their respective superconducting loops. The circulating currents corresponding to each of the states characterize distinct magnetic fields generated by such circulating currents.

Readout devices 120-1 and 120-2 and coupling device J1-2 are illustrated in FIG. 12B with the same shaded box because, in some embodiments, they are the same type of device, having similar structure and components, but configured to perform different functions in integrated circuit 1202. For example, coupling device J1-2 can be a dc-SQUID configured to tunably couple nodes N1 and N2. Coupling device J1-2 may be monostable, meaning it only has one potential minimum. Readout devices 120-1 and 120-2 may be dc-SQUIDs inductively coupled to corresponding nodes and configured to controllably detect the current in such nodes. Alternatively, readout devices 120-1 and 120-2 may be any device capable of detecting the state of corresponding nodes N1 and N2.

Bias devices 110-1 and 110-2 are illustrated in FIG. 12B as loops of metal. A local magnetic field can be applied to the corresponding node from a bias device 110 by driving a current through the loop of the bias device. Bias devices 110 may be made of metals that are superconducting at low temperatures, such as aluminum and niobium. The bias devices may not be loops, but simply wires that pass near corresponding nodes N thereby coupling magnetic flux into the loops. Each bias device 110 may comprise a wire that passes near a corresponding node, then connects to another metal layer, such as a ground plane, on the chip using a via. Integrated circuits like circuit 1202 of FIG. 12B may directly map from the ISG lattice and include all of the necessary degrees of control to process information.

FIG. 13A illustrates an embodiment of a lattice-based set of nodes 1300 comprising a graph having five nodes, N1 through N5, and four coupling devices, J1-3, J2-3, J3-4 and J3-5. FIG. 13B illustrates a translation of lattice 1300 to an integrated circuit 1302. Integrated circuit 1302 includes five quantum devices, N1 through N5, corresponding to the five nodes of lattice 1000 and four coupling devices, J1-3, J2-3, J3-4 and J3-5, connecting the five quantum devices, corresponding to the coupling devices of lattice 1000. Integrated circuit 1302 further comprises local bias devices 110-1, 110-2, 110-4 and 110-5 as well as readout devices 120-1, 120-2, 120-4 and 120-5. For clarity, FIG. 13B does not explicitly show a local bias device or readout device for node N3. Aspects of integrated circuit 1302 may be placed on separate layers to optimize for space constraints. In this case, a local bias device or readout device for node N3 could be placed on the layer above or below the layer in which N3 is fabricated. Each of the components of integrated circuit 1302 can be the same as corresponding components of circuit 1002 (FIG. 10B) with the exception that node N3 in the center shares four coupling devices with adjacent nodes N1, N2, N4, and N5.

There may be unused quantum devices next to N1, N2, N4 and N5 in integrated circuit 1302. However, for clarity, such unused quantum devices are not shown in FIG. 13B. Each graph encoded in integrated circuit 1302 can make use of any number of qubits that are present in the integrated circuit.

One or more of quantum devices N1 through N5 of integrated circuit 1302 may be configured as a gradiometric loop, such that a magnetic field only affects the gradiometric loop when the field is non-uniform across the loop. Gradiometric loops can be useful for facilitating coupling and for reducing the susceptibility of the system to external magnetic field noise. Nearest-neighbor nodes may be arranged at perpendicular angles or at near-perpendicular angles to reduce parasitic coupling (e.g., crosstalk) between neighboring nodes. A first and second node are considered to be arranged at a perpendicular angle with respect to each other when a first principal axis of the first node and a second principal axis of the second node are aligned perpendicularly with respect to each other.

Figures 14A, 14B:
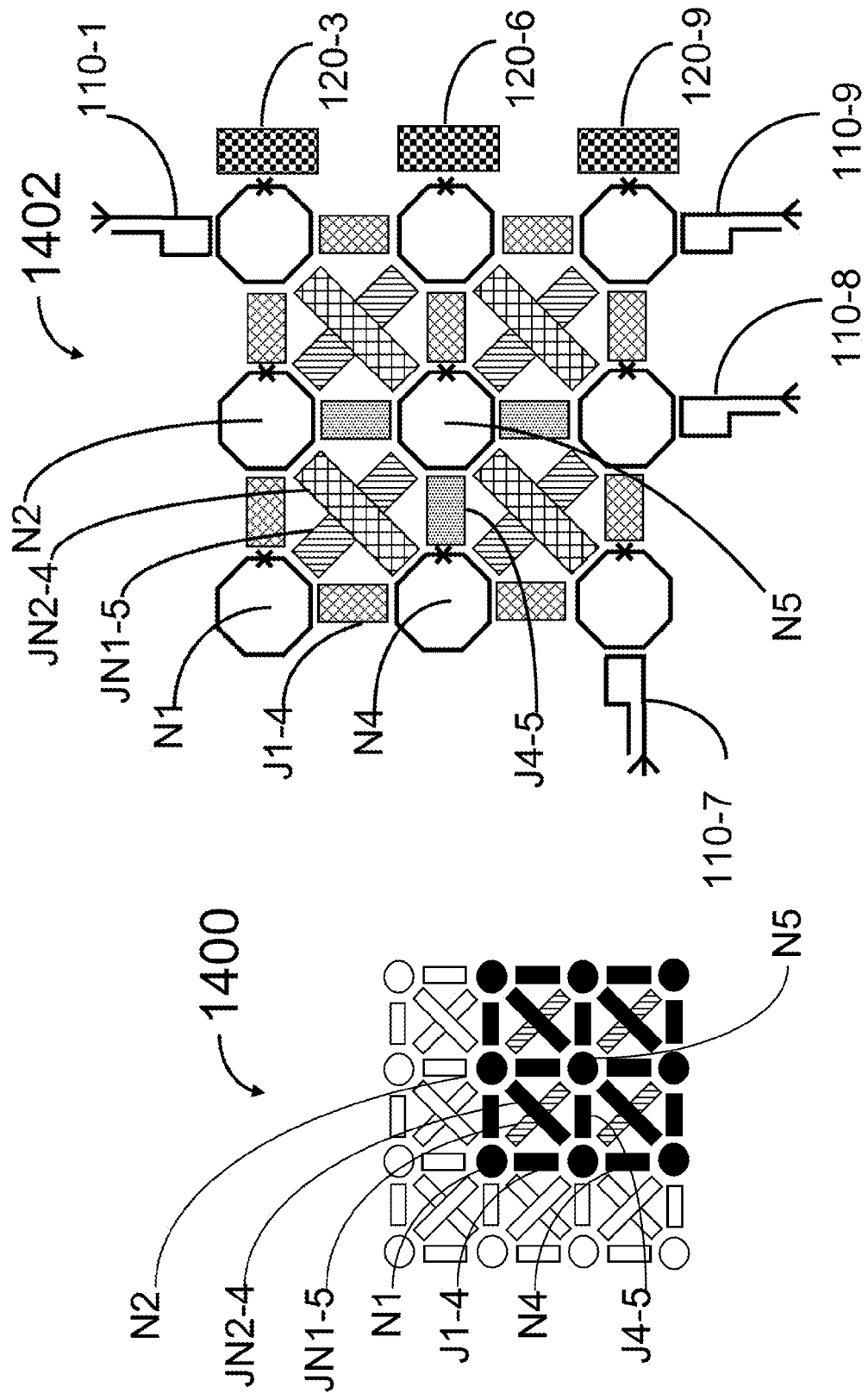
FIGS. 14A and 14B illustrate another embodiment of the methods, articles and systems for mapping a lattice-based graph to an integrated circuit.

FIG. 14A illustrates an embodiment of a lattice-based set of nodes 1400 having nine active nodes, N1 through N9, and respective coupling devices and FIG. 14B illustrates a translation of lattice 1400 to an integrated circuit 1402 having nine nodes N1 through N9, and twenty coupling devices. For clarity, in FIGS. 14A and 14B only nodes N1, N2, N4 and N5, and couplings J1-4, JN1-5, JN2-4 and J4-5 are labeled. Local bias devices 110-1, 110-7, 110-8 and 110-9, as well as readout devices 120-3, 120-6 and 120-9 are also labeled in integrated circuit 1402. FIG. 14B does not explicitly include a local bias device for all nodes. Aspects of integrated circuit 1402 may be placed on separate layers to optimize for space constraints. In such instances, a local bias device or readout device for the nodes that do not have a local bias device shown in FIG. 14B, could be placed on the layer above or below the layer in which these nodes are fabricated. The bias devices may not be loops, but simply wires that pass near the nodes N and couple magnetic flux into the loop. The bias devices may consist of a wire that passes near the qubit on the same or a different layer, then connects to a via, which connects to another metal layer, such as a ground plane, on the chip.

Each component of integrated circuit 1402 can be the same as corresponding components in integrated circuits 1202 and 1302. Such components have been described above in conjunction with FIGS. 12B and 13B. One difference between integrated circuit 1402 and the other circuits is the addition of next-nearest neighbor coupling devices JN in integrated circuit 1402, e.g., JN2-4 and JN1-5. As shown, next-nearest neighbor coupling device JN2-4 crosses over the top of next-nearest neighbor coupling device JN1-5. Wires in one or both of coupling devices JN1-5 and JN2-4 may be on multiple layers.

Next-nearest neighbor coupling devices, such as coupling devices JN2-4 and JN1-5, may be dc-SQUIDs or alternatively, rf-SQUIDs. They may be equivalent to coupling devices J of FIG. 12B, but only differ in their structure. In FIG. 14B, only three readout devices 120-3, 120-6, 120-9 are shown, for reading out corresponding nodes N3, N6, and N9, respectively. All the other nodes may have a corresponding readout device 120. Alternatively, only a few readout devices may be used and a classical state-copying technique may be used to copy the state of the internal nodes to perimeter nodes N3, N6, N9, as described, for example, in U.S. Patent Application Ser. No. 60/675,139 titled, "Methods of Ferromagnetic and Adiabatic Classical Qubit State Copying," which is hereby incorporated herein by reference in its entirety.

Although not shown in FIG. 14B, there may be unused quantum devices next to the perimeter quantum devices N1, N2, N3, N4, N6, N7, N8 and N9 in integrated circuit 1402. One or more of quantum devices N1 through N9 in integrated circuit 1402 may be configured as gradiometric loops, such that magnetic fields only affect the quantum devices when they are non-uniform across the superconducting loops of such quantum devices. Gradiometric loops can be useful for facilitating coupling and for reducing the susceptibility of the system to external magnetic field noise. Nearest-neighbor quantum devices may be arranged at perpendicular angles or at near-perpendicular angles to reduce parasitic coupling (e.g., crosstalk) between neighboring devices.

Figure 15:
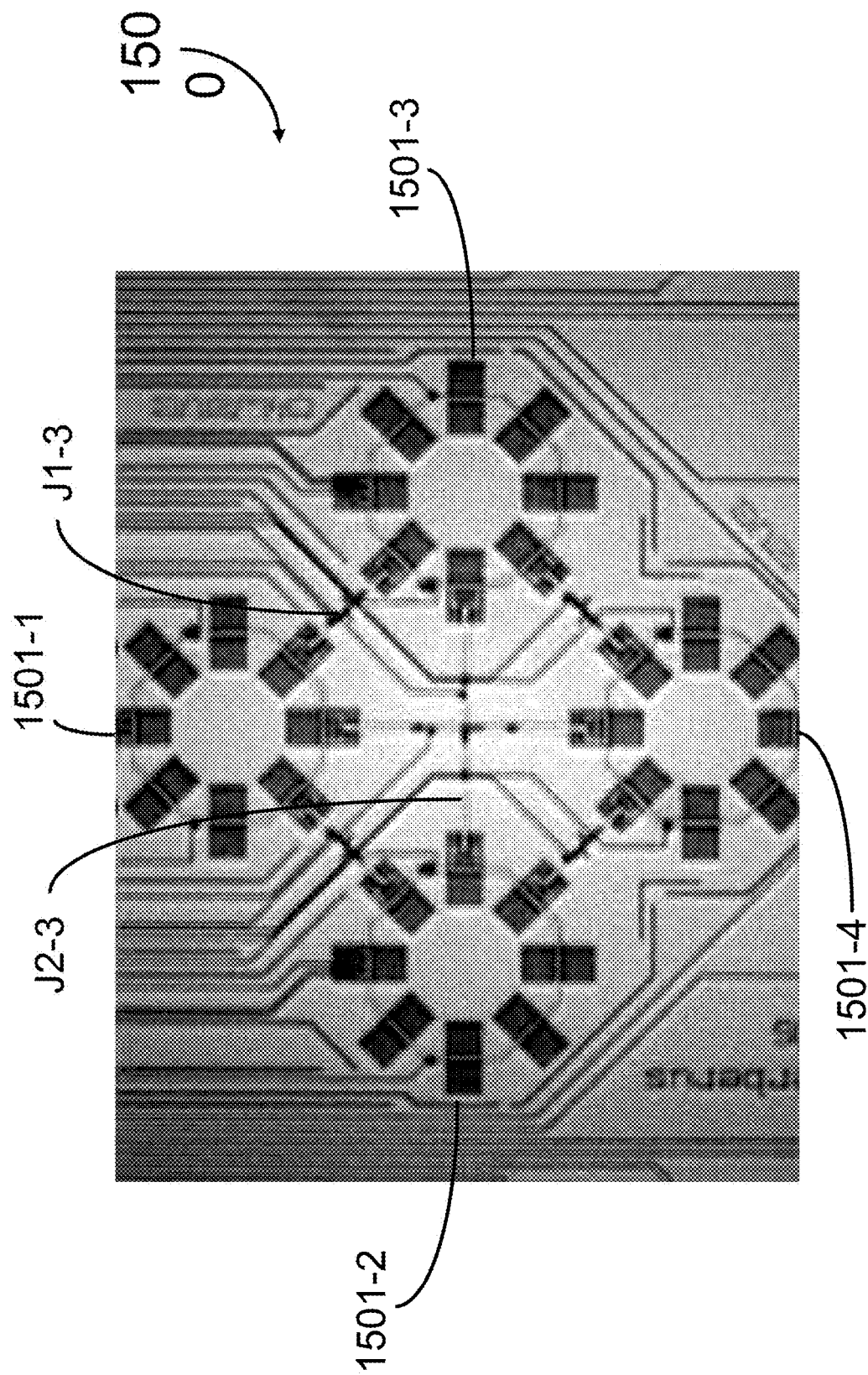
FIG. 15 is a photograph of a set of four quantum devices coupled to each other in accordance with an embodiment of the present methods, articles and systems.

FIG. 15 shows a photograph of an example of a physical layout of the present methods, articles and systems. Four flux-based quantum devices, 1501-1 through 1501-4, have been fabricated on a superconducting integrated circuit. Each quantum device is coupled to every other quantum device in the photograph using nearest-neighbor and next-nearest neighbor coupling. For example, coupling device J1-3 is a nearest-neighbor coupling device used to couple together quantum devices 1501-1 and 1501-3. Nearest-neighbor couplings also exist between quantum devices 1501-1 and 1501-2, 1501-2 and 1501-4, and 1501-3 and 1501-4, although the coupling devices are not explicitly labeled. Coupling device J2-3 is an example of next-nearest neighbor coupling, and couples together quantum devices 1501-2 and 1501-3. Another next-nearest neighbor coupling exists between quantum devices 1501-1 and 1501-4, although it is not explicitly labeled. Readout devices and local bias devices are also present on the circuit, but they are not shown in FIG. 15.

Figure 16:
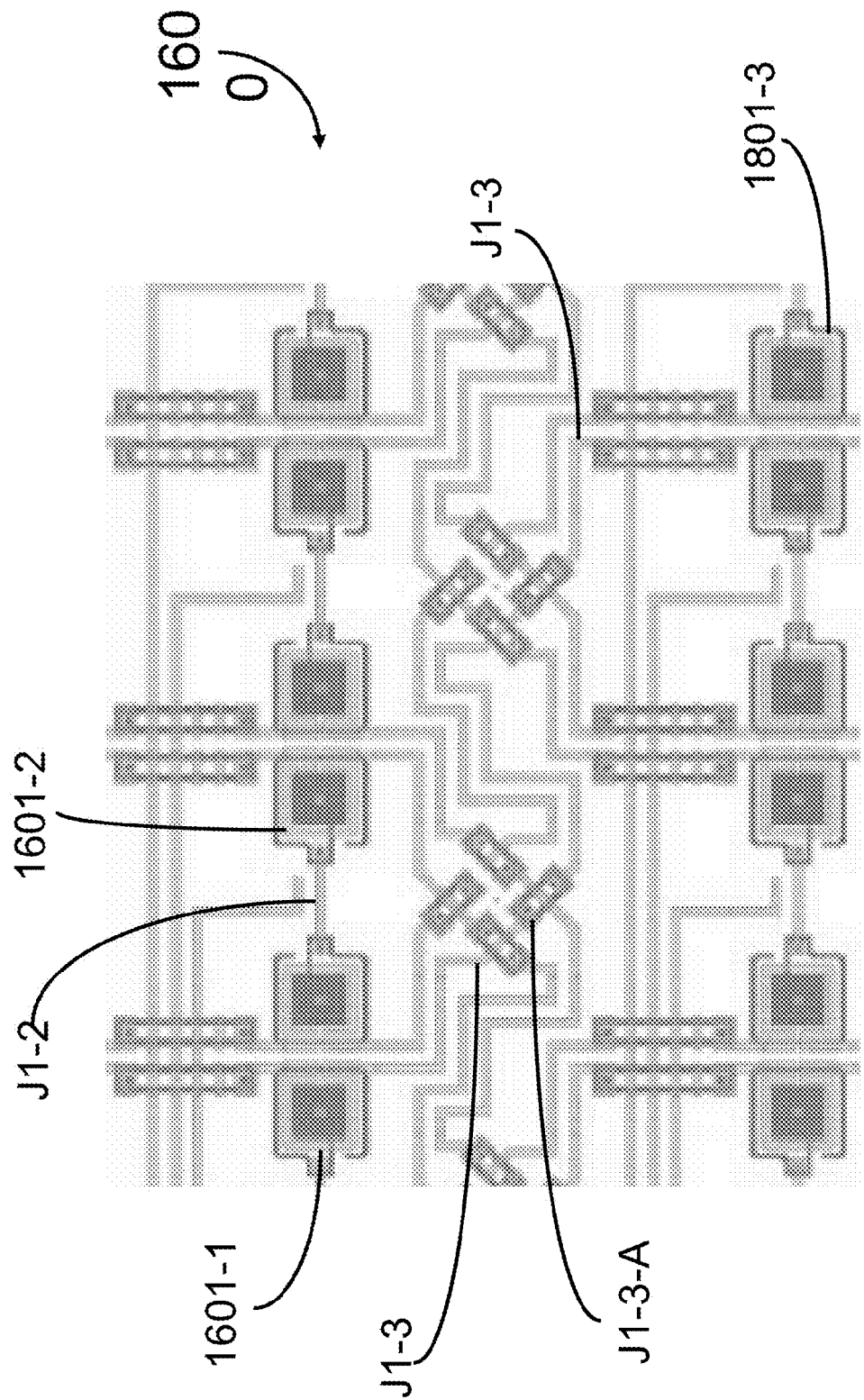
FIG. 16 illustrates a layout of an analog processor in accordance with an embodiment of the present methods, articles and systems.

FIG. 16 shows an alternative layout of the present methods, articles and systems. There are six quantum devices present in the figure, three of them being labeled 1601-1, 1601-2, and 1601-3. However, the layout shown is easily extended to any number of quantum devices. Quantum devices 1601-1 and 1601-2 are coupled together through coupling device J1-2. Coupling device J1-2 may be an rf-SQUID or alternatively a dc-SQUID. Quantum devices 1601-1 and 1601-3 are coupled together through coupling device J1-3, which in FIG. 16 is a direct galvanic coupling. Thus, quantum devices 1601-1 and 1601-3 are ferromagnetically coupled and have the same quantum state. Implementing coupling device J1-3 may comprise utilizing vias to create a path for the coupling device that uses a plurality of metal layers. An example is crossing J1-3-A in FIG. 16, where a section of coupling device J1-3 is fabricated on another metal layer and connected to the original layer using two vias. Such techniques are well known in the art.

5.4 Analog Processing 5.4.1 System-Level

One aspect of the present methods, articles and systems provides methods for finding the minimum energy configuration or approximate minimum energy configuration given a set of initial conditions. Such methods generally comprise mapping a problem to be solved onto a lattice layout topology. This lattice layout topology is mapped onto a circuit comprising a lattice of quantum devices between which are arranged couplings. The quantum devices and couplings are individually initialized and run-time control is invoked through the use of local bias control on the quantum devices and couplings or through the use of a global bias field. In this way, the lattice layout topology that represents the problem to be solved is mapped onto a physical lattice of quantum devices. The solution to the problem is then read out as the final state of the lattice of quantum devices. The solution may have the form of a binary number.

5.4.2 Initialization

Initialization of an analog processor with quantum features comprises initializing the state at each quantum device and initializing the state of each coupling device that will be used to represent a problem being solved. The potential energy profile of the quantum device representing a node in a graph to be solved may be a double-well potential, similar to that described by Friedman et al. 2000, "Detection of a Schrödinger's Cat State in an rf-SQUID," arXiv.org:cond-mat/0004293v2, which is hereby incorporated by reference in its entirety. FIGS. 17A and 17B each show a graph of a double-well potential. Energy is represented on the y-axis and some other dependent variable associated with the device, such as the internal flux of the quantum device, is represented on the x-axis. The system is described by a particle moving within this potential profile. If the particle is in the left well, it is in the $|L\rangle$ state, and if the particle is in the right well it is in the $|R\rangle$ state. These two states can be labeled $|0\rangle$ and $|1\rangle$, respectively, or $|1\rangle$ and $|0\rangle$ respectively. In a superconducting flux qubit or persistent-current qubit, these two states correspond to two different directions of circulating current, left-circulating and right-circulating. The initialization of the state at each node is done either through local tuning of the bias at each node or through the use of a global biasing field. Optionally, such tuning can also be effected by reducing the barrier height 1700 between states. If the potential energy profile is tilted to one side as shown in FIG. 17A, the particle will have a greater probability of moving into the lower energy well. In the case of FIG. 17A, this would be the $|R\rangle$ state 160-1. If the potential well profile is tilted to the other side, the particle will have a greater probability of moving into the opposite well. In the case of FIG. 17A, this would be the $|L\rangle$ state 160-0.

Initializing a quantum device whose state is described by the position of a particle in a double-well potential comprises tilting the potential to one side by tuning the local field bias at the node and waiting a sufficient amount of time such that the particle moves to the lower potential with some high probability. The local field bias may be a magnetic field and tuning the local field bias at the node may comprise applying a current to a superconducting loop or coil in close proximity to the quantum device, so as to generate a local magnetic field bias in the quantum device. After a sufficient amount of time has passed, the device's state will relax into the lower energy well of the double-well potential, which is the desired initial state. The device's state may fall to the lower energy well through thermal escape or the device's state may reach the lowest energy state via tunneling processes through the barrier 1700. In some cases, both thermal escape and tunneling processes contribute to the initialization.

Initializing the local field bias at each quantum device may comprise setting a global field bias across the entire lattice of quantum devices and waiting for a certain period of time. Applying a global field bias causes all the quantum devices to be initialized to the same state. The global bias may be a magnetic field. Each quantum device representing a node may comprise a loop of superconducting material interrupted by one or more Josephson junctions, wherein initialization can be effected by applying a global magnetic field across all the quantum devices that will cause each quantum device to be initialized in the same persistent-current state.

A quantum device in an integrated circuit that may be used to solve a computational problem is a loop of superconducting material interrupted by one or more Josephson junctions. Such a loop can be suitably constructed such that it has a potential energy profile that is described by a double-well potential like that shown in FIG. 17A or 17B. The two wells in the double-well potential correspond to two different directions of persistent current in the loop of superconducting material (e.g., currents 102-0 and 102-1 of FIG. 1A). The loop can be initialized into a desired state by tilting the double-well potential, as in FIG. 17A. Such tilting can be effected, for example, through application of an external flux bias through the superconducting loop. In some cases, once it is certain that the quantum device's state has become initialized to the lowest energy state, the external flux bias may be removed. An external flux may be applied to a superconducting loop by placing a loop or coil of wire in close proximity to the superconducting loop and applying a bias current through the loop or coil of wire. This bias current causes a change in magnetic field through the superconducting loop that affects the potential of the quantum device.

The height of barrier 1700 can be varied by altering the critical current of the Josephson junction(s) that interrupt the superconducting loop. In a standard rf-SQUID, it is possible to vary this during fabrication, but once the device is built, the critical current of a junction is typically fixed. However, if the single Josephson junction in an rf-SQUID is replaced with a compound Josephson junction, then it is possible to tune the effective critical current even after fabrication. This is accomplished by applying a magnetic field to the small split junction loop, and by tuning this magnetic field, the effective critical current of the rf-SQUID is varied.

One or more quantum devices that serve as nodes in an integrated circuit may be rf-SQUIDs. An rf-SQUID is a loop of superconducting material with one or more Josephson junctions interrupting the loop. A device in which the loop has three Josephson junctions is known as a 3JJ qubit. Such an rf-SQUID type device can be configured such that its potential energy profile is described by a double-well potential. The two wells in the double-well potential correspond to two different directions of persistent current in the loop of superconducting material. Devices with rf-SQUIDs exhibiting quantum behavior are shown in Friedman 2000. An external flux may be applied to the superconducting loop of the rf-SQUID by applying a bias current to a loop or coil of wire placed in close proximity to the superconducting loop of the rf-SQUID.

Figure 18:
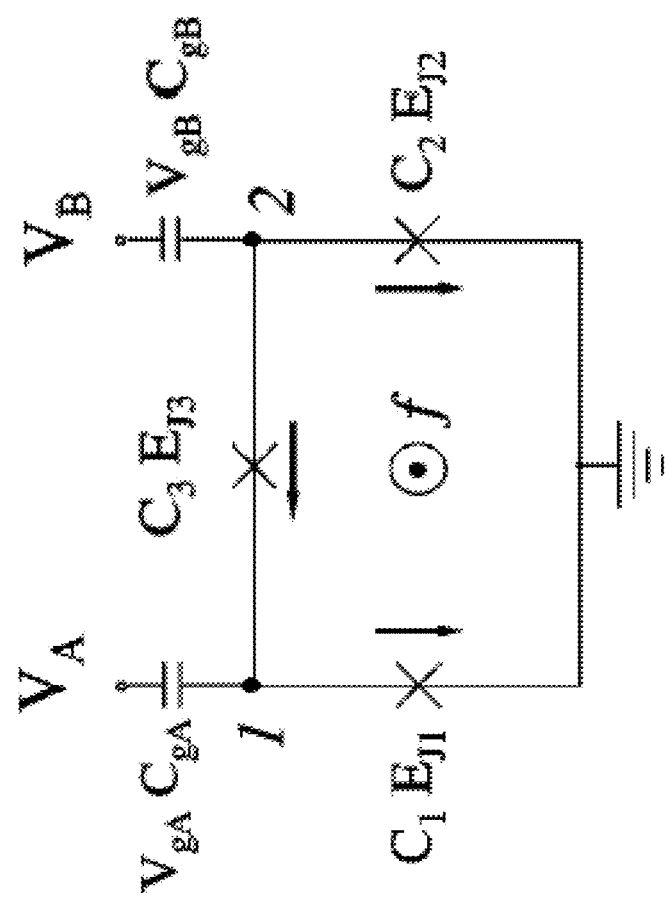
FIG. 18 illustrates a persistent current qubit in accordance with the prior art.

Each quantum device in an integrated circuit used to solve a quantum problem (e.g., quantum processor) may be a loop of superconducting material with three Josephson junctions interrupting the loop. Methods of initialization of these types of qubits may be the same as those described above in the case of rf-SQUID quantum devices. These types of devices do not require a large loop inductance and hence do not require a large loop area in order to have a double-well potential energy profile. Devices with three Josephson junctions are described in Orlando. One or more quantum devices may be a persistent current qubit such as the one illustrated in FIG. 18, which has been reproduced from Orlando. Such a device can serve as a quantum device in integrated circuits of the present methods, articles and systems. Each Josephson junction in the superconducting loop in FIG. 18 is marked by an X and is modeled by a parallel combination of an ideal Josephson junction and a capacitor $C_i$. The parallel resistive channel is assumed negligible. The ideal Josephson junction has a current-phase relation, $I_i = I_0 \sin \phi_j$ where $\phi_j$ is the gauge-invariant phase of junction i. A feature of the Josephson energy of each junction X in FIG. 18 is that it is a function of two phases. For a range of magnetic frustration f, these two phases, $\phi_1$ and $\phi_2$, permit two stable configurations, which correspond to DC currents flowing in opposite directions. As discussed in Orlando, by considering the charging energy (the capacitive energy) of the junctions and considering the circuit quantum mechanically, the parameters of the circuit can be adjusted so that the two lowest states of the system near $f=\frac{1}{2}$ will correspond to the two classical states of opposite circulating currents.

All or a portion of the quantum devices in an integrated circuit used to solve a computational problem may be compound Josephson junction rf-SQUIDs. A compound Josephson junction rf-SQUID is similar to an rf-SQUID except the single Josephson junction is replaced by a dc-SQUID, also known as a compound Josephson junction, connected to the rf-SQUID loop. A dc-SQUID is made of two or more Josephson junctions connected in parallel with two electrical contacts formed between the junctions. This device behaves in a similar way to an rf-SQUID with the exception that it has an extra degree of control in the sense that the critical current in the loop can be varied by tuning the flux through the dc-SQUID loop. Tuning the critical current changes the barrier height that separates the two left-well and right-well states, |L⟩ and |R⟩, of the double well potential. The flux through the large rf-SQUID loop still tunes the tilt of the double-well potential as in a standard rf-SQUID. Initializing the quantum device may comprise either tilting the double-well potential by applying a flux bias to the rf-SQUID loop, or reducing the barrier height between the two wells by applying a bias to the dc-SQUID loop, or both, and then waiting for the device to initialize in the ground state. Tuning the flux through the dc-SQUID loop represents $\sigma^x$ control over the state of the quantum device.

Each quantum device in an integrated circuit used to solve a computational problem may be a gradiometer qubit. Initializing gradiometer qubits is done using similar methods as for rf-SQUIDs. Methods for initializing gradiometer qubits include applying a flux bias and then waiting for some period of time. An external flux may be applied to a loop by applying a bias current to a loop or coil of wire placed in close proximity to the loop. Gradiometer qubits consist of two superconducting lobes in electrical communication with each other and with opposing current orientations. Initialization may involve applying a flux bias to one of the two lobes or to both lobes.

Methods for initializing quantum devices have been discussed above. Coupling devices are also initialized. In some cases, a coupling device is initialized by setting the coupling device to a desired initial state and then waiting a certain amount of time characteristic of the coupling device to ensure that the coupling device is in fact set at the desired initial state. As a result of such initialization, coupling devices are initialized into a state where J=−1 or J=1, where the coupling strength J is normalized such that the desired coupling strength for a given problem corresponds to J=|1|.

At least one coupling device in an integrated circuit may be a quantum superconducting device. For instance, coupling devices may be rf-SQUIDs in the integrated circuits. In such cases, initializing of an rf-SQUID that serves as a coupling device can comprise application of a local flux bias to the coupling device. This can be accomplished by placing a bias current through a superconducting loop or coil that is in close proximity to the coupling device. Rf-SQUIDs used as coupling devices may be monostable, meaning their potential function only has one minimum. All or a portion of the coupling devices in the integrated circuits (e.g., quantum processors) may be dc-SQUIDs and initialization of such coupling devices comprises direct application of a bias current to such coupling devices.

All or a portion of the coupling devices in the integrated circuits (e.g., quantum processors) may be gradiometer couplings. Methods for initializing a gradiometer coupling that serves as a coupling device in an integrated circuit comprise applying a flux bias to one of the lobes of the gradiometer or to both lobes of the gradiometer.

5.4.3 Run-Time Control

In accordance with embodiments of the present methods, articles and systems, methods for performing run-time control of an analog processor comprise varying the quantum device effective bias. This can be done either by tuning the individual local field bias at each quantum device in the analog processor, tuning the coupling strength of couplings between the pairs of quantum devices in the analog processor, or by tuning the barrier height of individual quantum devices, which is equivalent to changing the effective temperature of the system, where the system is composed of a lattice of quantum devices and coupling elements.

To increase or decrease the effective temperature of the system, it suffices to lower or raise the barrier height of the quantum device, respectively. The barrier height of a quantum device is the potential barrier between the two potential wells of the energy landscape, illustrated as barrier 1700 in FIGS. 17A and 17B. If the quantum device comprises a compound junction, the barrier height of a quantum device can be changed by tuning the external magnetic field through the loop of the compound junction.

Where the effective temperature is used to reach the final state of an analog processor, the potential barrier of all the quantum devices are first lowered, which increases the effective temperature by making it easier for the quantum state of the analog processor to thermally escape from local minima. Then, the potential barrier of the quantum devices is slowly raised, thereby decreasing the effective temperature, allowing the quantum state of the analog processor to find lower minima.

Annealing purely by thermal escape is known as classical annealing, since it takes no advantage of the quantum effects of the system. The method of finding the final state of the analog processor may be completely classical. Alternatively, quantum annealing may occur in addition to classical annealing. One form of quantum annealing is quantum tunneling, wherein the quantum state of the analog processor finds a lower minimum than the one it is currently in by tunneling through the potential barrier instead of thermally escaping it. Thus, quantum annealing can help the quantum state find lower minima when there is a statistically small chance of thermally escaping its present minima.

Finding the final state of an analog processor may be done by adiabatic quantum evolution. In adiabatic quantum evolution, the analog processor is initialized in the ground state of a quantum state of a known Hamiltonian. Then the quantum state is allowed to evolve adiabatically to a final Hamiltonian. The adiabatic evolution is usually slow enough to prevent the quantum state from moving from the ground state to an excited state. Adiabatic evolution can be effected by tuning the coupling strength between quantum devices in the processor or by tuning the individual bias of the quantum devices, or by tuning a global bias that affects all quantum devices. The final ground state represents the solution to a computational problem encoded by the final Hamiltonian. For more information about this process, see for example, U.S. Patent Application Publications 2005-0256007; 2005-0250651; and 2005-0224784, referred to above.

Methods for performing run-time control of an analog processor include the method of increasing the actual temperature of the analog processor through a thermal annealing process. The thermal annealing process may comprise increasing the temperature of the system from the base temperature to a temperature between 30 mK-3K, and then decreasing the temperature of the system to the base temperature.

5.4.4 Readout

Methods of reading out the state of the quantum devices in an integrated circuit (e.g., quantum processor) may comprise initializing a readout device and measuring a physical property of the readout device. There are two possible readout states for a quantum device, the $|0\rangle$ state and the $|1\rangle$ state. Reading out a quantum device collapses the quantum state of the device to one of the two classical states. Where the barrier height on the quantum device is tunable, the barrier height can be increased before reading out the state of the quantum device. Increasing the height of the barrier, e.g., barrier 1700 of FIG. 17, freezes the quantum device into either the $|0\rangle$ state or the $|1\rangle$ state.

The readout device may comprise a dc-SQUID magnetometer inductively connected to the quantum device, in which case determining the state of the quantum device comprises measuring a voltage or a current from the dc-SQUID magnetometer. This voltage or current can then be converted into a value representing the magnetic field at the quantum device.

Classical state copying may be used to reduce the number of read out devices required. See, for example, U.S. Patent Application 60/675,139, referred to above.

After the state of the quantum devices is read out, the results of the measurement may be transmitted using a data signal embodied on a carrier wave. The data signal may be a digital signal and digital computer 1102 (depicted in FIG. 11) may be used to generate the carrier wave in some cases.

5.5 Cited References

All of the U.S. patents, U.S. patent application publications, U.S. patent applications, foreign patents, foreign patent applications and non-patent publications referred to in this specification including, but not limited to, U.S. Pat. No. 6,670,630, U.S. Pat. No. 6,784,451, U.S. Pat. No. 6,822,255, U.S. Pat. No. 6,885,325, U.S. Pat. No. 6,897,468, U.S. Pat. No. 6,960,780, U.S. Pat. No. 6,979,836, U.S. Pat. No. 7,533,068, U.S. Pat. Nos. 8,008,942, 8,283,943, US 2002-0121636, US 2003-0107033, US 2003-0121028, US 2003-0169041, US 2003-0173498, US 2004-0000666, US 2004-0016918, US 2004-0119061, US 2004-0140537, US 2005-0224784, US 2005-0250651, US 2005-0256007, U.S. Patent Application Ser. Nos. 60/638,600, 60/640,420, 60/675,139, 60/705,503, Ser. Nos. 11/247,857, 13/608,836 and 14/175,731 are incorporated herein by reference, in their entirety and for all purposes.

5.6 Alternative Embodiments

As will be apparent to those skilled in the art, the various embodiments described above can be combined to provide further embodiments. Aspects of the invention can be modified, if necessary, to employ systems, circuits and concepts of the various patents, applications and publications to provide yet further embodiments of the invention. These and other changes can be made to the invention in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

We claim:

1. An apparatus comprising an analog processor, the analog processor comprising:
   a plurality of quantum devices for use in quantum computation, the plurality of quantum devices in a periodic arrangement of quantum devices; and
   a plurality of coupling devices, each coupling device of the plurality of coupling devices selectively operable to couple a respective pair of quantum devices of the plurality of quantum devices, wherein:
   the plurality of quantum devices and the plurality of coupling devices form a non-planar graph.

2. The apparatus of claim 1, wherein at least one of the quantum devices of the respective pair of quantum devices is operable to have quantum states.

3. The apparatus of claim 2, wherein the at least one of the quantum devices of the respective pair of quantum devices is operable to have two or more quantum states.

4. The apparatus of claim 1, wherein each of the quantum devices of the plurality of quantum devices is a superconducting device.

5. The apparatus of claim 1, wherein each of the coupling devices of the plurality of coupling devices is a superconducting device.

6. The apparatus of claim 1, wherein each of the coupling devices of the plurality of coupling devices is operable to tunably couple a respective pair of quantum devices of the plurality of quantum devices.

7. The apparatus of claim 6, wherein each of the coupling devices of the plurality of coupling devices is operable to tunably couple a respective pair of quantum devices of the plurality of quantum devices to a set of values ranging from a maximum coupling value for ferromagnetic coupling, to a maximum coupling value for anti-ferromagnetic coupling.

8. The apparatus of claim 6, further comprising a coupling device control system operationally coupled to tune a coupling value for one or more of the coupling devices in the plurality of coupling devices.

9. The apparatus of claim 1, wherein the analog processor further comprises a quantum device control system operationally coupled to apply a local bias field to one or more of the quantum devices in the plurality of quantum devices, via one or more local bias devices of a plurality of local bias devices.

10. The apparatus of claim 1 wherein the analog processor further comprises a plurality of readout devices operable to detect the state of one or more of the quantum devices in the plurality of quantum devices.

11. The apparatus of claim 1, further comprising a first digital computer communicatively coupled to the analog processor.

12. The apparatus of claim 11, further comprising:
a second digital computer communicatively coupled with the first digital computer; and
at least one non-transitory computer-readable storage media that stores processor-executable instructions, which when executed cause at least one processor to:
send a computational problem to be solved from the second digital computer to the first digital computer;
send the computational problem to be solved from the first digital computer to the analog processor;
receive the answer to the computational problem from the analog processor; and
send an answer to the computational problem from the first digital computer to the second digital computer.

13. The apparatus of claim 1, further comprising at least one non-transitory computer-readable storage media stores processor-executable instructions, which when executed cause at least one processor to:
initialize the analog processor in an initial state; and
cause the analog processor to evolve from the initial state towards a final state.

14. The apparatus of claim 13, wherein the analog processor further comprises a readout device communicatively coupled to one or more of the quantum devices in the plurality of quantum devices; and wherein the processor-executable instructions when executed further cause the at least one processor to read out the final state via the readout device.

15. The apparatus of claim 1, wherein a first set of two or more of the coupling devices in the plurality of coupling devices crosses a second set of two or more of the coupling devices in the plurality of coupling devices.

16. The apparatus of claim 1, wherein the periodic arrangement is two-dimensional.

17. The analog processor of claim 9, wherein each local bias device in the plurality of local bias devices is inductively coupled to a corresponding one of the quantum devices in the plurality of quantum devices.

18. The apparatus of claim 1, wherein each of the quantum devices in the plurality of quantum devices comprises a loop of superconducting material interrupted by at least one Josephson junction.

19. The apparatus of claim 18, wherein each of the quantum devices in the plurality of quantum devices comprises a respective compound Josephson junction.

20. The apparatus of claim 19, wherein each of the quantum devices in the plurality of quantum devices comprises a respective loop inductively coupled to a respective one of the compound Josephson junctions.

21. The apparatus of claim 1, wherein the plurality of coupling devices comprises a plurality of monostable rf-SQUIDS.

22. The apparatus of claim 1, wherein the analog processor further comprises a plurality of read out devices, a respective read out device of the plurality of read out devices communicatively coupled to a respective one of the quantum devices of the plurality of quantum devices.

* * * * *